United States Patent
Fernando et al.

(10) Patent No.: US 9,620,954 B2
(45) Date of Patent: Apr. 11, 2017

(54) SEMICONDUCTOR PACKAGE HAVING AN OVER-TEMPERATURE PROTECTION CIRCUIT UTILIZING MULTIPLE TEMPERATURE THRESHOLD VALUES

(71) Applicant: Infineon Technologies Americas Corp., El Segundo, CA (US)

(72) Inventors: Dean Fernando, Torrance, CA (US); Roel Barbosa, Sta. Rosa Laguna (PH); Toshio Takahashi, Rancho Palos Verdes, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 103 days.

(21) Appl. No.: 14/152,723

(22) Filed: Jan. 10, 2014

(65) Prior Publication Data

US 2014/0126256 A1    May 8, 2014

Related U.S. Application Data

(63) Continuation-in-part of application No. 13/662,244, filed on Oct. 26, 2012, now Pat. No. 9,324,638, which
(Continued)

(51) Int. Cl.
*H02M 7/5387*    (2007.01)
*H02H 7/122*    (2006.01)
(Continued)

(52) U.S. Cl.
CPC ......... *H02H 7/122* (2013.01); *H01L 23/4952* (2013.01); *H01L 23/49513* (2013.01);
(Continued)

(58) Field of Classification Search
USPC .............. 363/50, 55, 56.01–56.04, 144–147
See application file for complete search history.

(56) References Cited

U.S. PATENT DOCUMENTS 5,773,883 A    6/1998    Majumdar
5,998,856 A    12/1999    Noda
(Continued)

FOREIGN PATENT DOCUMENTS

CN    102569241    7/2012
EP    2 463 904    6/2012
(Continued)

OTHER PUBLICATIONS

U.S. Appl. No. 61/459,527, filed Dec. 13, 2010, Fernando.
(Continued)

*Primary Examiner* — Jeffrey Gblende
(74) *Attorney, Agent, or Firm* — Shumaker & Sieffert, P.A.

(57) ABSTRACT

According to an exemplary implementation, a semiconductor package includes a multi-phase power inverter having power switches and situated on a leadframe of the semiconductor package. The semiconductor package further includes an over-temperature protection circuit configured to reduce current through the power switches based on multiple temperature threshold values of the power switches and a sensed temperature of the power switches. The over-temperature protection circuit can be configured to enter first and second modes based on the multiple temperature threshold values and the sensed temperature, where the second mode reduces current through the power switches to a greater extent than the first mode.

18 Claims, 8 Drawing Sheets

Related U.S. Application Data is a continuation of application No. 13/034,519, filed on Feb. 24, 2011, now Pat. No. 8,587,101.

(60) Provisional application No. 61/780,417, filed on Mar. 13, 2013, provisional application No. 61/459,527, filed on Dec. 13, 2010.

(51) Int. Cl.
   *H01L 23/495* (2006.01)
   *H01L 23/31* (2006.01)
   *H01L 23/00* (2006.01)

(52) U.S. Cl.
   CPC .. *H01L 23/49541* (2013.01); *H01L 23/49548* (2013.01); *H01L 23/49562* (2013.01); *H01L 23/49575* (2013.01); *H02M 7/5387* (2013.01); *H01L 23/3107* (2013.01); *H01L 24/29* (2013.01); *H01L 24/32* (2013.01); *H01L 24/45* (2013.01); *H01L 24/48* (2013.01); *H01L 24/49* (2013.01); *H01L 24/73* (2013.01); *H01L 2224/05554* (2013.01); *H01L 2224/0603* (2013.01); *H01L 2224/2929* (2013.01); *H01L 2224/29101* (2013.01); *H01L 2224/29339* (2013.01); *H01L 2224/32245* (2013.01); *H01L 2224/45015* (2013.01); *H01L 2224/45144* (2013.01); *H01L 2224/45147* (2013.01); *H01L 2224/48091* (2013.01); *H01L 2224/48137* (2013.01); *H01L 2224/48247* (2013.01); *H01L 2224/4903* (2013.01); *H01L 2224/49111* (2013.01); *H01L 2224/49171* (2013.01); *H01L 2224/73265* (2013.01); *H01L 2924/014* (2013.01); *H01L 2924/01005* (2013.01); *H01L 2924/0105* (2013.01); *H01L 2924/01006* (2013.01); *H01L 2924/01029* (2013.01); *H01L 2924/01033* (2013.01); *H01L 2924/01047* (2013.01); *H01L 2924/01079* (2013.01); *H01L 2924/01082* (2013.01); *H01L 2924/1305* (2013.01); *H01L 2924/13055* (2013.01); *H01L 2924/13064* (2013.01); *H01L 2924/13091* (2013.01); *H01L 2924/181* (2013.01); *H01L 2924/3011* (2013.01); *H01L 2924/30111* (2013.01)

(56) References Cited

U.S. PATENT DOCUMENTS

| | | | |
|---|---|---|---|
| 6,137,165 A | 10/2000 | Thierry | |
| 6,211,549 B1 | 4/2001 | Funaki | |
| 6,249,024 B1 | 6/2001 | Mangtani | |
| 6,313,598 B1 | 11/2001 | Tamba | |
| 6,465,875 B2 | 10/2002 | Connah | |
| 6,610,923 B1 | 8/2003 | Nagashima | |
| 7,145,224 B2 | 12/2006 | Kawashima et al. | |
| 7,436,070 B2 | 10/2008 | Uno et al. | |
| 7,554,181 B2 | 6/2009 | Satou et al. | |
| 7,659,144 B2 | 2/2010 | Shirai et al. | |
| 8,587,101 B2 | 11/2013 | Fernando et al. | |
| 8,803,499 B2 | 8/2014 | Sreenivas | |
| 9,324,638 B2 | 4/2016 | Fernando et al. | |
| 2001/0045627 A1 | 11/2001 | Connah | |
| 2002/0109211 A1 | 8/2002 | Shinohara | |
| 2002/0113617 A1* | 8/2002 | Gergintschw | H03K 17/0822 326/32 |
| 2003/0006434 A1 | 1/2003 | Kawafuji et al. | |
| 2003/0107120 A1 | 6/2003 | Connah et al. | |
| 2004/0135248 A1 | 7/2004 | Takagawa | |
| 2004/0196678 A1* | 10/2004 | Yoshimura | H02M 7/5387 363/79 |
| 2004/0227476 A1 | 11/2004 | Guerra | |
| 2004/0227547 A1 | 11/2004 | Shiraishi et al. | |
| 2005/0054186 A1 | 3/2005 | Kim et al. | |
| 2006/0001318 A1 | 1/2006 | Ahmad | |
| 2006/0043545 A1* | 3/2006 | Yea | H01L 23/49575 257/666 |
| 2006/0113664 A1 | 6/2006 | Shiraishi | |
| 2006/0240599 A1 | 10/2006 | Amano | |
| 2007/0064370 A1* | 3/2007 | Kajiwara | H03K 17/08104 361/103 |
| 2007/0116553 A1* | 5/2007 | Chen | F04D 27/02 415/47 |
| 2007/0126092 A1 | 6/2007 | San Antonio | |
| 2007/0200537 A1 | 8/2007 | Akiyama | |
| 2007/0216011 A1 | 9/2007 | Otremba | |
| 2007/0228534 A1 | 10/2007 | Uno et al. | |
| 2008/0002445 A1 | 1/2008 | Cho et al. | |
| 2008/0023831 A1 | 1/2008 | Nishimura et al. | |
| 2008/0074068 A1 | 3/2008 | Takeuchi | |
| 2008/0150436 A1* | 6/2008 | Suzuki | H02M 3/156 315/169.3 |
| 2008/0217662 A1 | 9/2008 | Harnden | |
| 2008/0224323 A1 | 9/2008 | Otremba | |
| 2008/0252372 A1 | 10/2008 | Williams | |
| 2009/0095979 A1 | 4/2009 | Saito | |
| 2009/0189261 A1 | 7/2009 | Lim et al. | |
| 2009/0212733 A1 | 8/2009 | Hsieh | |
| 2009/0261462 A1 | 10/2009 | Gomez | |
| 2009/0262468 A1* | 10/2009 | Ide | H01L 23/34 361/18 |
| 2009/0321927 A1 | 12/2009 | Nishimura | |
| 2010/0059875 A1 | 3/2010 | Sato | |
| 2010/0127683 A1 | 5/2010 | Uno | |
| 2010/0148590 A1 | 6/2010 | Kojima | |
| 2010/0164419 A1 | 7/2010 | Suh | |
| 2010/0165681 A1 | 7/2010 | Sakano | |
| 2010/0301464 A1 | 12/2010 | Arshad | |
| 2011/0049685 A1 | 3/2011 | Park | |
| 2011/0110011 A1* | 5/2011 | Dittfeld | B60R 21/017 361/248 |
| 2011/0169102 A1 | 7/2011 | Uno | |
| 2011/0254143 A1 | 10/2011 | Chen | |
| 2012/0126378 A1 | 5/2012 | San Antonio | |
| 2012/0267750 A1 | 10/2012 | Imai et al. | |
| 2012/0273892 A1 | 11/2012 | Uno | |
| 2013/0155745 A1 | 6/2013 | Tanaka | |
| 2014/0131846 A1 | 5/2014 | Shiramizu | |
| 2015/0235932 A1 | 8/2015 | Fernando | |

FOREIGN PATENT DOCUMENTS

| | | |
|---|---|---|
| JP | H 9-102580 | 4/1997 |
| JP | 2000091499 A | 3/2000 |
| JP | 2001135765 A | 5/2001 |
| JP | 3384399 | 3/2003 |
| JP | 2004147401 | 5/2004 |
| JP | 2004342735 A | 12/2004 |
| JP | 2005086200 A | 3/2005 |
| JP | 2005183463 | 7/2005 |
| JP | 2005183463 A | 7/2005 |
| JP | 2005217072 A | 8/2005 |
| JP | 2005294464 A | 10/2005 |
| JP | 2006512040 A | 4/2006 |
| JP | 2007227416 A | 9/2007 |
| JP | 2007266218 A | 10/2007 |
| JP | 2008034567 A | 2/2008 |
| JP | 2009-27090 | 2/2009 |
| JP | 2010067755 A | 3/2010 |
| JP | 2011-29262 | 2/2011 |
| JP | 2012129489 | 7/2012 |
| JP | 2012-175070 | 9/2012 |
| KR | 1020030063835 A | 7/2003 |
| KR | 1020060045597 A | 5/2006 |
| TW | 201240046 | 10/2012 |
| WO | WO 98/24128 | 6/1998 |

OTHER PUBLICATIONS

U.S. Appl. No. 61/774,484, filed Mar. 7, 2013, Fernando.

(56) References Cited

OTHER PUBLICATIONS

U.S. Appl. No. 61/774,506, filed Mar. 7, 2013, Fernando.
U.S. Appl. No. 61/774,535, filed Mar. 7, 2013, Fernando.
U.S. Appl. No. 61/774,541, filed Mar. 7, 2013, Fernando.
U.S. Appl. No. 61/777,341, filed Mar. 12, 2013, Fernando.
U.S. Appl. No. 61/777,753, filed Mar. 12, 2013, Fernando.
U.S. Appl. No. 61/780,069, filed Mar. 13, 2013, Fernando.
U.S. Appl. No. 61/780,417, filed Mar. 13, 2013, Fernando.
U.S. Appl. No. 61/782,460, filed Mar. 14, 2013, Fernando.
U.S. Appl. No. 13/034,519, filed Feb. 24, 2011, Fernando.
U.S. Appl. No. 13/662,244, filed Oct. 26, 2012, Fernando.
U.S. Appl. No. 14/076,467, filed Nov. 11, 2013, Fernando.
U.S. Appl. No. 14/102,275, filed Dec. 10, 2013, Fernando.
U.S. Appl. No. 14/102,316, filed Dec. 10, 2013, Fernando.
U.S. Appl. No. 14/102,379, filed Dec. 10, 2013, Fernando.
U.S. Appl. No. 14/140,285, filed Dec. 24, 2013, Fernando.
U.S. Appl. No. 14/147,464, filed Jan. 3, 2014, Fernando.
U.S. Appl. No. 14/150,469, filed Jan. 8, 2014, Fernando.
U.S. Appl. No. 14/152,640, filed Jan. 10, 2014, Fernando.
U.S. Appl. No. 14/152,816, filed Jan. 10, 2014, Fernando.
Prosecution History from U.S. Pat. No. 8,587,101, dated Aug. 16, 2012 through Oct. 18, 2013, 69 pp.
Prosecution History from U.S. Pat. No. 9,324,638, dated Oct. 26, 2012 through Mar. 30, 2016, 198 pp.

* cited by examiner (Top View)

(Top View)

(Bottom View)

SEMICONDUCTOR PACKAGE HAVING AN OVER-TEMPERATURE PROTECTION CIRCUIT UTILIZING MULTIPLE TEMPERATURE THRESHOLD VALUES

The present application claims the benefit of and priority to provisional application Ser. No. 61/780,417, filed on Mar. 13, 2013, and entitled "Semiconductor Package Having an Over-Temperature Protection Circuit Utilizing Multiple Temperature Threshold Values." The present application is also a continuation-in-part of application Ser. No. 13/662,244 filed on Oct. 26, 2012, and entitled "Compact Wirebonded Power Quad Flat No-Lead (PQFN) Package," which in turn claims priority to application Ser. No. 13/034,519 filed on Feb. 24, 2011, and entitled "Multi-Chip Module (MCM) Power Quad Flat No-Lead (PQFN) Semiconductor Package Utilizing a Leadframe for Electrical Interconnections," which in turn claims priority to provisional application Ser. No. 61/459,527 filed on Dec. 13, 2010, and entitled "Low Cost Leadframe Based High Power Density Full Bridge Power Device." The present application claims the benefit of and priority to all of the above-identified applications. Moreover, the disclosure and contents of all of the above-identified applications are hereby incorporated fully by reference into the present application.

BACKGROUND

Definition

As used herein, the phrase "group III-V" refers to a compound semiconductor including at least one group III element and at least one group V element. By way of example, a group III-V semiconductor may take the form of a III-Nitride semiconductor. "III-Nitride", or "III-N", refers to a compound semiconductor that includes nitrogen and at least one group III element such as aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), aluminum indium gallium arsenide phosphide nitride ($Al_xIn_yGa_{(1-x-y)}As_aP_bN_{(1-a-b)}$), for example. III-Nitride also refers generally to any polarity including but not limited to Ga-polar, N-polar, semi-polar, or non-polar crystal orientations. A III-Nitride material may also include either the Wurtzitic, Zincblende, or mixed polytypes, and may include single-crystal, monocrystalline, polycrystalline, or amorphous structures. Gallium nitride or GaN, as used herein, refers to a III-Nitride compound semiconductor wherein the group III element or elements include some or a substantial amount of gallium, but may also include other group III elements in addition to gallium. A group III-V or a GaN transistor may also refer to a composite high voltage enhancement mode transistor that is formed by connecting the group III-V or the GaN transistor in cascade with a lower voltage group IV transistor.

In addition, as used herein, the phrase "group IV" refers to a semiconductor that includes at least one group IV element such as silicon (Si), germanium (Ge), and carbon (C), and may also include compound semiconductors such as silicon germanium (SiGe) and silicon carbide (SiC), for example. Group IV also refers to semiconductor materials which include more than one layer of group IV elements, or doping of group IV elements to produce strained group IV materials, and may also include group IV based composite substrates such as silicon on insulator (SOI), separation by implantation of oxygen (SIMOX) process substrates, and silicon on sapphire (SOS), for example.

Background Art

Packages combining several semiconductor devices can simplify circuit design, reduce costs, and provide greater efficiency and improved performance by keeping related and dependent circuit components in close proximity. Furthermore, these packages can facilitate application integration and greater electrical and thermal performance compared to using separate packaging for components.

A leadframe-based package, as presently known in the art, includes power switches of a multi-phase power inverter circuit. The power switches can generate significant heat, and thus, the multi-phase power inverter circuit may include an over-temperature protection circuit to protect the power switches from high temperatures, which may result from an overload or other cause. The over-temperature protection circuit is discrete and separate from the leadframe-based package and completely disables switching of all of the power switches responsive to a sensed temperature exceeding a single temperature threshold value of the power switches. The sensed temperature is from a temperature sensor, and as with the over-temperature protection circuit, the temperature sensor is discrete and separate from the leadframe-based package. For example, a discrete temperature sensor may be mounted on a printed circuit board (PCB) external to the leadframe-based package.

SUMMARY

A semiconductor package having an over-temperature protection circuit utilizing multiple temperature threshold values, substantially as shown in and/or described in connection with at least one of the figures, and as set forth more completely in the claims.

DETAILED DESCRIPTION

Figure 1A:
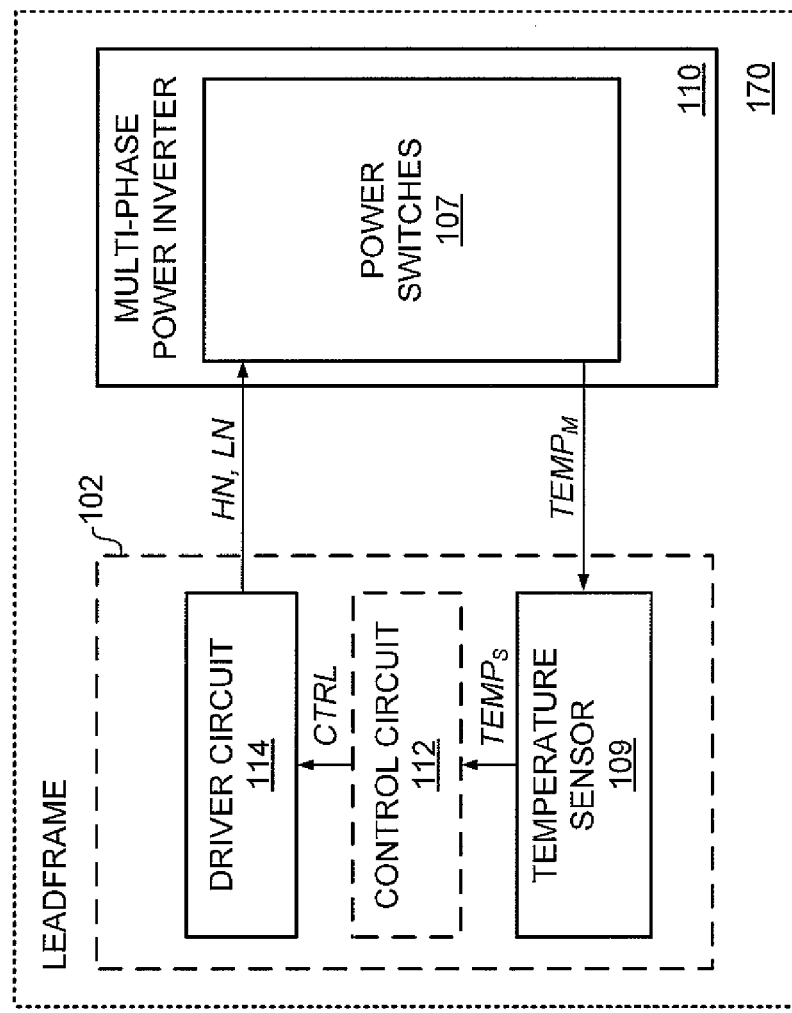
FIG. 1A illustrates a block diagram of an exemplary semiconductor package.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1A illustrates a block-diagram of semiconductor package 100. Semiconductor package 100 includes leadframe 170, multi-phase power inverter 110, temperature sensor 109, and driver circuit 114.

Multi-phase power inverter 110 can be, for example, a two phase or three phase power inverter and has power switches 107. Where multi-phase power inverter 110 is a three phase power inverter, for example, power switches 107 can include U-phase, V-phase, and U-phase power switches. Driver circuit 114 is situated on leadframe 170 and is configured to drive power switches 107 of multi-phase power inverter 110. More particularly, driver circuit 114 is configured to provide high side drive signals HN and low side drive signals LN to respective gates of power switches 107 of multi-phase power inverter 110.

Driver circuit 114 is configured to generate high side drive signals HN and low side drive signals LN based on at least control signals CTRL from control circuit 112. As indicated by dashed lines, in some implementations, semiconductor package 100 also includes control circuit 112. However, control circuit 112 may be external to semiconductor package 100. For example, semiconductor package 100 may receive control signals CTRL from control circuit 112, which may be in a microcontroller, as one example.

Thus, semiconductor package 100 includes power switches 107 of a multi-phase power inverter circuit on leadframe 170. Multi-phase power inverter circuits may include a temperature sensor to measure the temperature of power switches. However, proper measurement of the temperature of the power switches can require particular placement of the temperature sensor. In response, leadframe-based packages typically require the temperature sensor to be discrete from the leadframe-based package. However, semiconductor package 100 includes temperature sensor 109 situated on leadframe 170. By including temperature sensor 109 on leadframe 170, semiconductor package 100 can simplify circuit design, reduce costs, and provide greater efficiency and improved performance to a multi-phase power inverter circuit. Furthermore, temperature sensor 109 can be placed much closer to power switches 107, driver circuit 114, and/or control circuit 112, providing highly accurate and fast temperature sensing.

As shown in FIG. 1A, temperature sensor 109 is configured to generate sensed temperature $TEMP_S$ of power switches 107 from temperature measurement $TEMP_M$, which is provided by power switches 107. Driver circuit 114 is configured to drive power switches 107 of multi-phase power inverter 110 responsive to sensed temperature $TEMP_S$. For example, in the implementation shown, control circuit 112 is configured to generate control signals CTRL based on sensed temperature $TEMP_S$. As driver circuit 114 is configured to generate high side drive signals HN and low side drive signals LN based on control signals CTRL, driver circuit 114 drives power switches 107 of multi-phase power inverter 110 responsive to sensed temperature $TEMP_S$. However, in some implementations, driver circuit 114 can instead receive sensed temperature $TEMP_S$ and generate high side drive signals HN and low side drive signals LN based on sensed temperature $TEMP_S$.

Figure 1B:
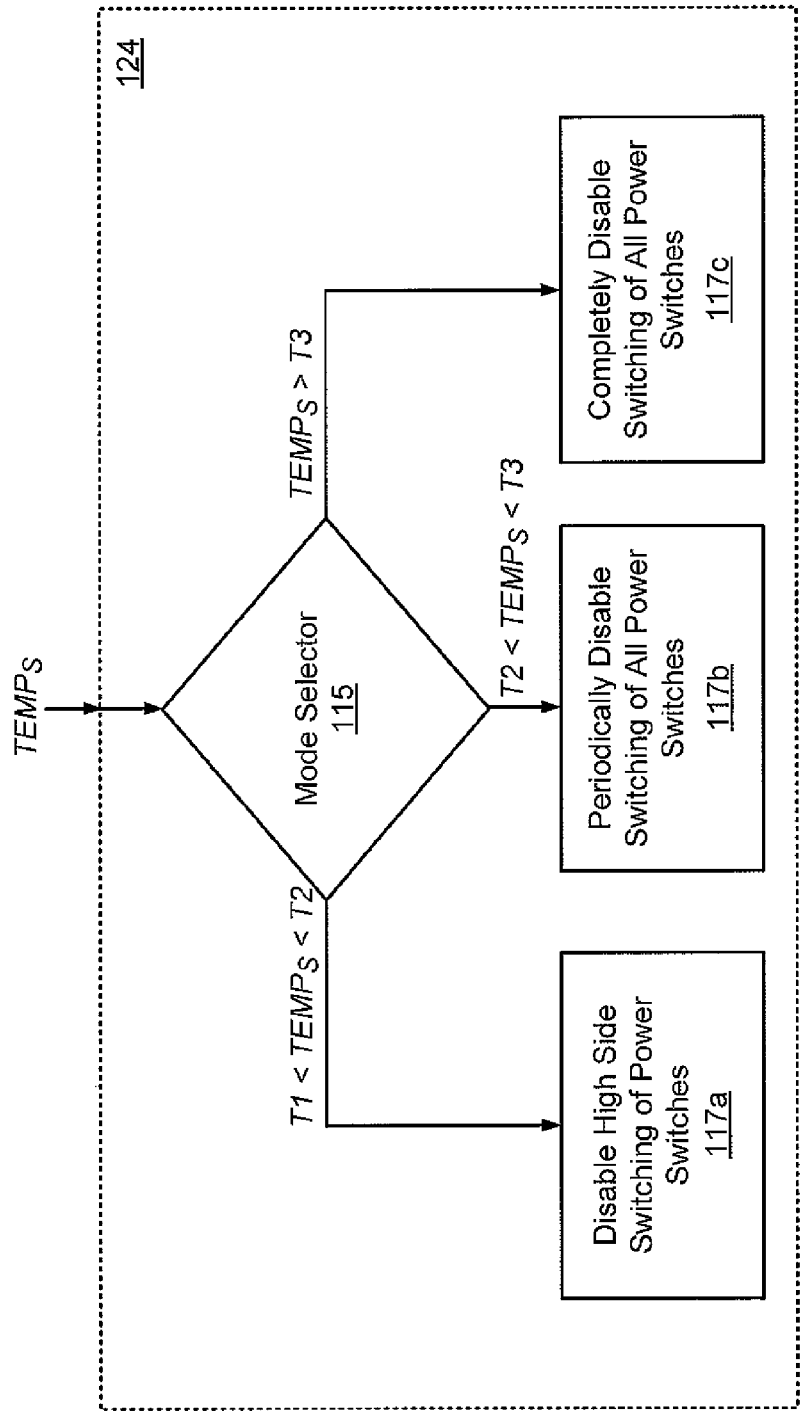
FIG. 1B illustrates a block diagram of an exemplary over-temperature protection circuit of a semiconductor package.

Sensed temperature $TEMP_S$ is utilized by driver circuit 114 and/or control circuit 112 to provide over-temperature protection to power switches 107. Referring now to FIG. 1B, FIG. 1B illustrates a block diagram of over-temperature protection circuit 124 of semiconductor package 100. In semiconductor package 100, power switches 107 can generate significant heat. Over-temperature protection circuit 124 is configured to protect power switches 107 from high temperatures, which may result from an overload or other cause.

Typical over-temperature protection circuits must utilize a single temperature threshold value of power switches as temperature sensing for those circuits are not sufficiently fast and accurate so as to allow for more granular temperature sensing. However, over-temperature protection circuit 124 is configured to reduce current through power switches 107 based on multiple temperature threshold values of power switches 107 and sensed temperature $TEMP_S$ of power switches 107. As current through power switches 107 is reduced, the heat generated by power switches 107 is also reduced, which can thereby reduce the temperature of power switches 107. In the implementation shown in FIG. 1B, the multiple temperature threshold values correspond to temperature threshold values T1, T2, and T3. While FIG. 1B shows three temperature threshold values, the multiple threshold values can generally correspond to two or more temperature threshold values.

Also in the implementation shown, over-temperature protection circuit 124 includes mode selector 115, which receives sensed temperature $TEMP_S$. Mode selector 115 is configured to select between at two least different over-temperature protection modes of over-temperature protection circuit 124. The different temperature protection modes provide different approaches to reducing current through power switches 107. In doing so, over-temperature protection circuit 124 may provide over-temperature protection for power switches 107 without always completely disabling switching of all of power switches 107, thereby maintaining a level of operability in a multi-phase power inverter circuit.

In the implementation shown in FIG. 1B, the temperature protection modes include modes 117a, 117b, and 117c. Mode selector 115 is configured to compare sensed temperature $TEMP_S$ with temperature threshold values T1, T2, and T3 and select one of modes 117a, 117b, and 117c based on the comparison. Mode selector 115 can include a dedicated digital circuit and may utilize comparators in comparing sensed temperature $TEMP_S$ with temperature threshold values T1, T2, and T3.

Over-temperature protection circuit 124 is configured to enter mode 117a that reduces current through power switches 107 based on at least temperature threshold value T1 of power switches 107 and sensed temperature $TEMP_S$ of power switches 107. For example, over-temperature protection circuit 124 is configured to enter mode 117a based on sensed temperature $TEMP_S$ exceeding temperature threshold value T1, and more particularly if sensed temperature $TEMP_S$ is between temperature threshold values T1 and T2 (i.e. if sensed temperature $TEMP_S$ is within a first range of temperature threshold values). Temperature threshold value T1 can be, for example, approximately 100 degrees Celsius and temperature threshold value T2 can be, for example, approximately 220 degrees Celsius.

Mode 117a includes disabling only high side power switching of power switches 107. Mode 117a includes disabling only high side power switching for at least one of the high side power switches of power switches 107. In some implementations mode 117a includes disabling only high side power switching for all of the high side power switches of power switches 107.

Over-temperature protection circuit 124 is also configured to enter mode 117b that reduces current through power switches 107 based on at least temperature threshold value T2 of power switches 107 and sensed temperature $TEMP_S$ of power switches 107. For example, over-temperature protection circuit 124 is configured to enter mode 117b based on sensed temperature $TEMP_S$ exceeding temperature threshold value T2, and more particularly if sensed temperature $TEMP_S$ is between temperature threshold values T2 and T3 (i.e. if sensed temperature $TEMP_S$ is within a second range of temperature threshold values). Temperature threshold value T3 can be, for example, approximately 240 degrees Celsius.

Mode 117b includes periodically disabling switching of all of power switches 107. For example, for a 10 KHz carrier frequency, switching can be periodically disabled for a 100 ms period. By periodically disabling switching of all of power switches 107, current through power switches 107 can be reduced further than in mode 117a without completely disabling switching of all of power switches 107.

Over-temperature protection circuit 124 is also configured to enter mode 117c that reduces current through power switches 107 based on at least temperature threshold value T3 of power switches 107 and sensed temperature $TEMP_S$ of power switches 107. For example, over-temperature protection circuit 124 is configured to enter mode 117c based on sensed temperature $TEMP_S$ exceeding temperature threshold value T3 (i.e. if sensed temperature $TEMP_S$ is within a third range of temperature threshold values). Mode 117c includes completely disabling switching of all of power switches 107. It will be appreciated that over-temperature protection circuit 124 may enable switching of power switches 107 when sensed temperature $TEMP_S$ falls below temperature threshold value T3. If sensed temperature $TEMP_S$ still exceeds temperature threshold value T2, mode selector 115 can select mode 117b for over-temperature protection circuit 124.

As described above, mode 117b reduces current through power switches 107 to a greater extent than mode 117a. Also, mode 117c reduces current through power switches 107 to a greater extent than mode 117b. Thus, the current reduction through power switches 107 increases along with the multiple temperature threshold values and sensed temperature $TEMP_S$ of power switches 107.

Over-temperature protection circuit 124 can be included in control circuit 112 and/or driver circuit 114 of FIG. 1A. Where over-temperature protection circuit 124 is included in control circuit 112, over-temperature protection circuit 124 can provide over-temperature protection by varying control signals CTRL and thereby high side drive signals HN and low side drive signals LN. Where over-temperature protection circuit 124 is included in driver circuit 114, over-temperature protection circuit 124 can provide over-temperature protection by varying high side drive signals HN and low side drive signals LN. As indicated by dashed lines in FIG. 1A, in some implementations, semiconductor package 100 includes common integrated circuit (IC) 102. Common IC 102 can include any combination of driver circuit 114, control circuit 112, and temperature sensor 109. However, any combination of driver circuit 114, control circuit 112, and temperature sensor 109 can be separate from one another, for example, by being included on separate ICs. In many cases temperature sensor 109 cannot be included on common IC 102 as temperature sensor 109 would be too far from power switches 107 for proper measurement. However, as semiconductor package 100 is highly compact and thermally consistent, temperature sensor 109 can be in common IC 102 while still providing accurate sensed temperature $TEMP_S$ of power switches 107.

Also in the present implementation, sensed temperature $TEMP_S$ is from temperature sensor 109 that is situated on leadframe 170 of semiconductor package 100 where temperature sensor 109 is on common IC 102 with over-temperature protection circuit 124. Including temperature sensor 109 on common IC 102 with over-temperature protection circuit 124 can further increase the accuracy and speed of the temperature sensing, which may enable over-temperature protection circuit 124 to reduce current through power switches 107 based on additional temperature threshold values. Also, including temperature sensor 109 in common IC 102 simplifies circuit design, reduces costs, and allows for semiconductor package 100 to be made smaller.

Figure 2A:
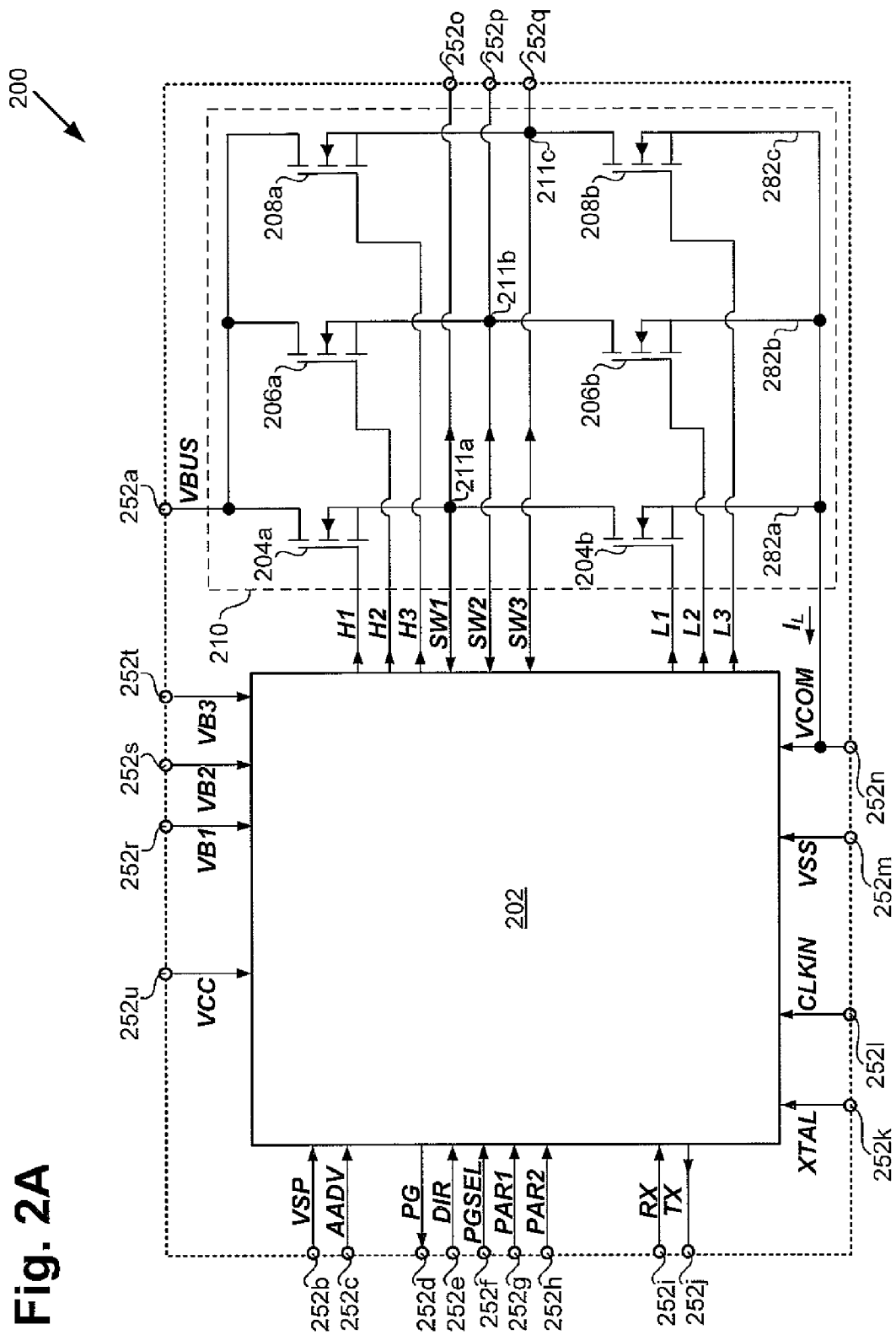
FIG. 2A illustrates a schematic diagram of an exemplary circuit of a semiconductor package.
Figure 2B:
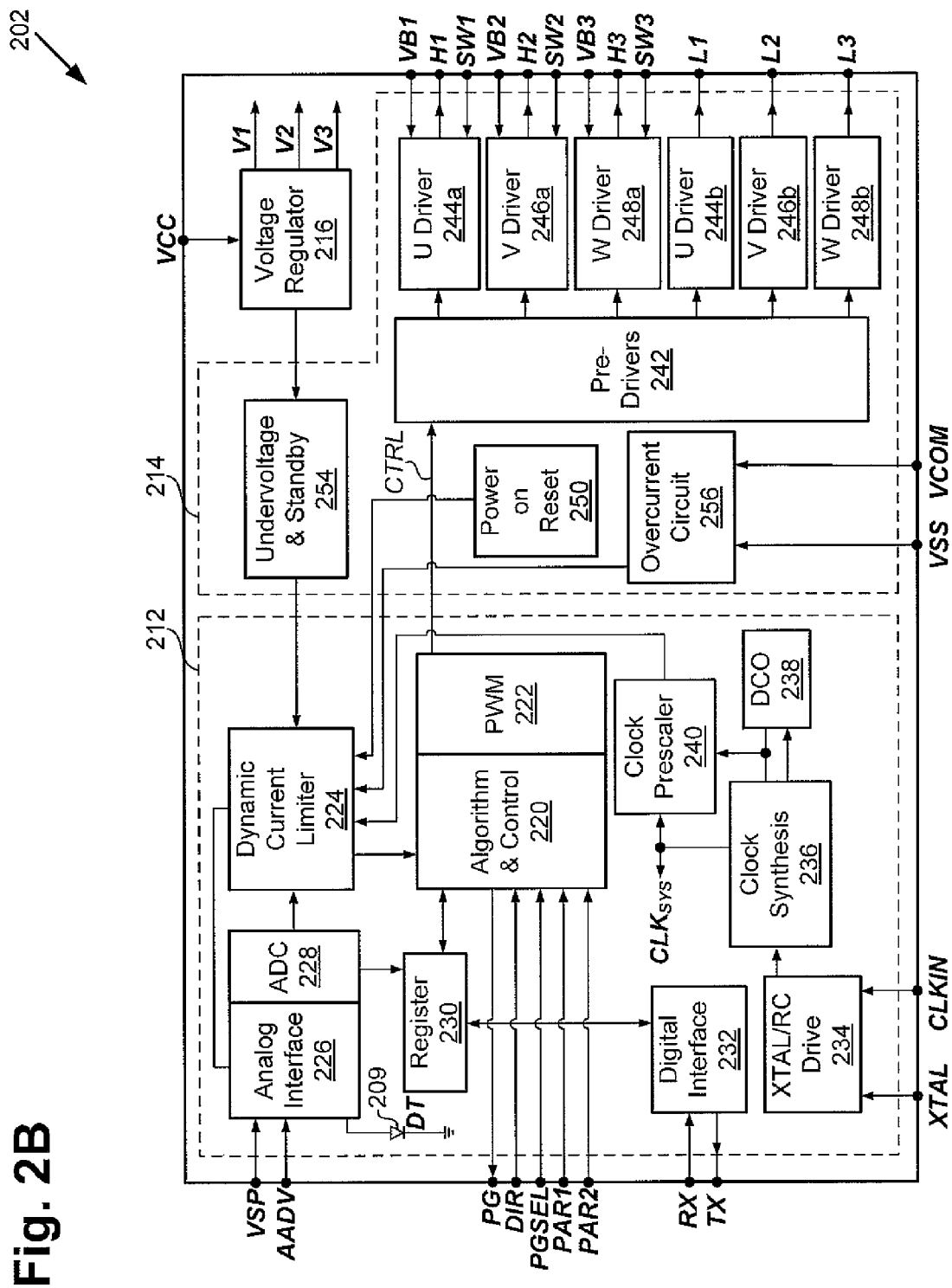
FIG. 2B illustrates a schematic diagram of an exemplary common IC of a semiconductor package.

FIG. 2A illustrates a schematic diagram of an exemplary circuit of semiconductor package 200. In some implementations, semiconductor package 200 corresponds to semiconductor package 100 in FIG. 1A. FIG. 2B illustrates a schematic diagram of common IC 202 of semiconductor package 200.

Referring to FIG. 2A, semiconductor package 200 includes common IC 202 and multi-phase power inverter 210, corresponding respectively to common IC 102 and multi-phase power inverter 110 in FIG. 1A. Multi-phase power inverter 210 includes U-phase power switches 204a and 204b, V-phase power switches 206a and 206b, and W-phase power switches 208a and 208b, which collectively correspond to power switches 107 in FIG. 1A.

As shown in FIG. 2B, common IC 202 includes control circuit 212 and driver circuit 214 corresponding respectively to control circuit 112 and driver circuit 114 in FIG. 1A. Common IC 202 also includes voltage regulator 216. Control circuit 212 includes algorithm and control circuit 220, pulse width modulation (PWM) circuit 222, over-temperature protection circuit 224 (also referred to as "dynamic current limiter 224"), analog interface 226, analog-to-digital converter (ADC) 228, register 230, digital interface 232, crystal drive circuit 234, clock synthesis circuit 236, digitally controlled oscillator (DCO) 238, and clock prescaler 240. Driver circuit 214 includes pre-drivers 242, U-phase drivers 244a and 244b, V-phase drivers 246a and 246b, and W-phase drivers 248a and 248b, power on reset circuit 250, overcurrent sensing circuit 256, and undervoltage and standby circuit 254.

FIG. 2A also shows semiconductor package 200 as having VBUS terminal 252a, VSP terminal 252b, AADV terminal 252c, PG terminal 252d, DIR terminal 252e, PGSEL terminal 252f, PAR1 terminal 252g, PAR2 terminal 252h, RX terminal 252i, TX terminal 252j, XTAL terminal 252k, CLKIN terminal 252l, VSS terminal 252m, VCOM terminal 252n, SW1 terminal 252o, SW2 terminal 252p, SW3 terminal 252q, VB1 terminal 252r, VB2 terminal 252s, VB3 terminal 252t, and VCC terminal 252u, which are collectively referred to as I/O terminals 252.

Figure 2C:
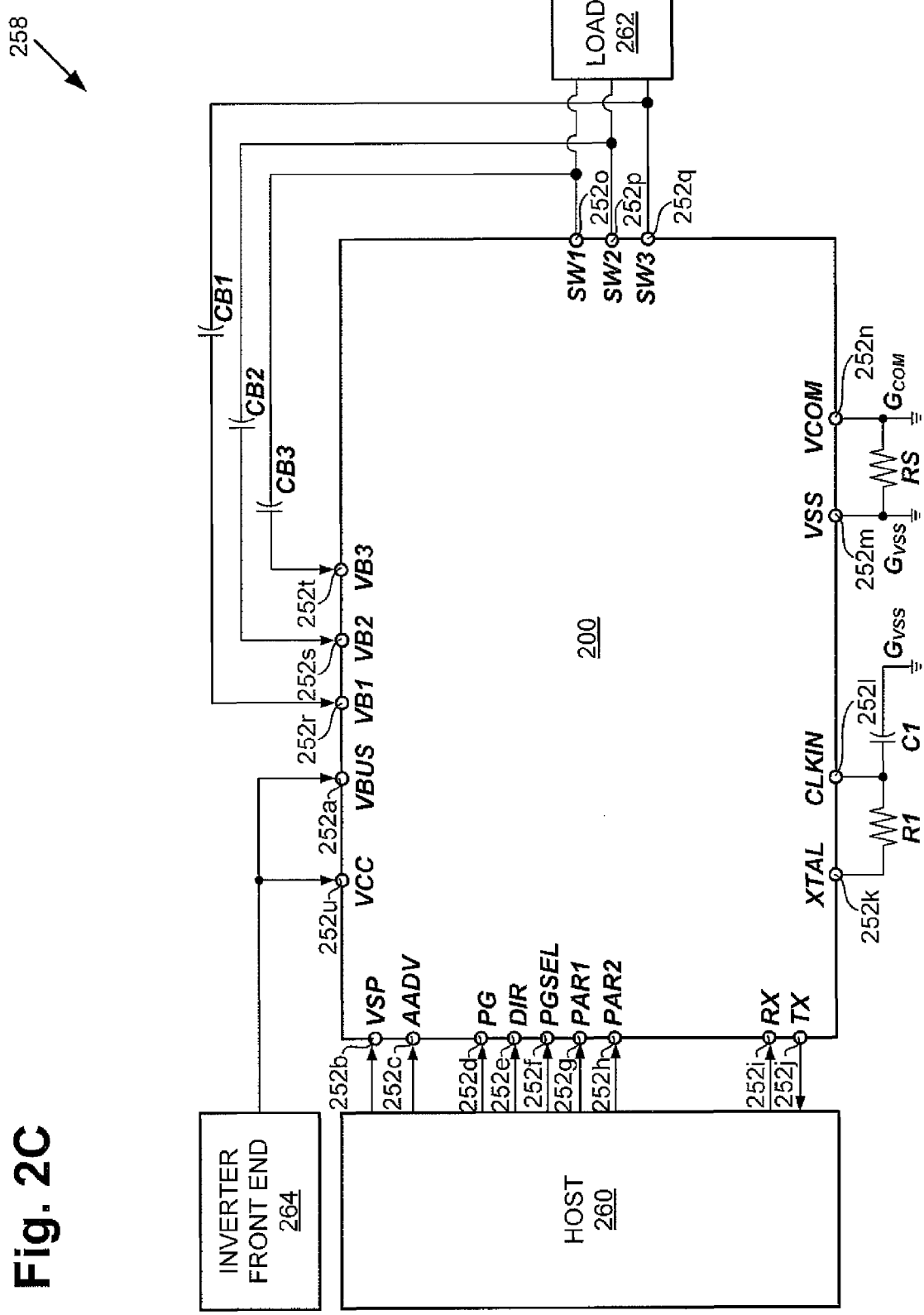
FIG. 2C illustrates a schematic diagram of a semiconductor package in an exemplary multi-phase power inverter circuit.

FIG. 2C illustrates a schematic diagram of semiconductor package 200 in multi-phase power inverter circuit 258. More particularly, FIG. 2C shows an exemplary manner in which I/O terminals 252 of semiconductor package 200 can be connected in multi-phase power inverter circuit 258. FIG. 2C shows host 260, load 262, inverter front end 264, shunt RS, resistor R1, capacitor C1, and bootstrap capacitors CB1, CB2, and CB3 coupled to semiconductor package 200.

In semiconductor package 200, driver circuit 214 of FIG. 2B is configured to drive multi-phase power inverter 210 responsive to a control signal (e.g. control signals CTRL, corresponding to control signals CTRL in FIG. 1A) from control circuit 212. Control circuit 212 is configured to generate the control signal (e.g. control signals CTRL) and to provide the control signal to driver circuit 214. By including driver circuit 214 and control circuit 212 in semiconductor package 200, semiconductor package 200 can simplify circuit design, reduce costs, and provide greater efficiency and improved performance, amongst other advantages. Including control circuit 212 and driver circuit 214 on common IC 202, as shown in FIG. 2B, may enhance these advantages.

Thus, common IC 202 is configured to generate control signals CTRL and to drive multi-phase power inverter 210 responsive to control signals CTRL. In multi-phase power inverter 210, U-phase power switches 204a and 204b, V-phase power switches 206a and 206b, and W-phase power switches 208a and 208b are vertical conduction power devices, for example, group IV semiconductor power metal-oxide-semiconductor field effect transistors (power MOSFETs) such as fast-reverse epitaxial diode field effect transistors (FREDFETs), or group IV semiconductor insulated-gate bipolar transistors (IGBTs). In other implementations group III-V semiconductor FETs, HEMTs (high electron mobility transistors) and, in particular, GaN FETs and/or HEMTs can be used as power devices in U-phase power switches 204a and 204b, V-phase power switches 206a and 206b, and W-phase power switches 208a and 208b. As defined above, Gallium nitride or GaN, as used herein, refers to a III-Nitride compound semiconductor wherein the group III element or elements include some or a substantial amount of gallium, but may also include other group III elements in addition to gallium. As previously stated, a group III-V or a GaN transistor may also refer to a composite high voltage enhancement mode transistor that is formed by connecting the group III-V or the GaN transistor in cascode with a lower voltage group IV transistor. Semiconductor package 200 provides a full bridge power device, however, alternative implementations can provide other package configurations as required by the particular application. Also, while multi-phase power inverter 210 is a three phase power inverter, in some implementations, multi-phase power inverter 210 may be a two phase power inverter.

As described above, driver circuit 214 is configured to drive multi-phase power inverter 210 responsive to control signals CTRL from control circuit 212. Control circuit 212 is a three phase control circuit and thus, control signals CTRL include control signals for U-phase power switch 204a, V-phase power switch 206a, and W-phase power switch 208a, which are high side power switches. Pre-drivers 242, which can include a high-voltage level shifter, receive control signals CTRL. The high-voltage level shifter can have termination that can sustain, for example, approximately 600 volts.

Level shifted versions of control signals CTRL are received by U-phase driver 244a, V-phase driver 246a, and W-phase driver 248a. U-phase driver 244a, V-phase driver 246a, and W-phase driver 248a further receive SW1, SW2, and SW3 from U-phase output 211a, V-phase output 211b, and W-phase output 211c (shown in FIG. 2A) respectively. U-phase driver 244a, V-phase driver 246a, and W-phase driver 248a generate high side gate signals H1, H2, and H3 from control signals CTRL and provide high side gate signals H1, H2, and H3 to U-phase power switch 204a, V-phase power switch 206a, and W-phase power switch 208a, as shown in FIG. 2A. Thus, U-phase driver 244a, V-phase driver 246a, and W-phase driver 248a are high side drivers and are coupled to high side power switches of multi-phase power inverter 210. High side gate signals H1, H2, and H3 in FIGS. 2A and 2B collectively correspond to high side drive signals HN in FIG. 1A.

Similarly, control signals CTRL include control signals for U-phase power switch 204b, V-phase power switch 206b, and W-phase power switch 208b, which are low side power switches. Pre-drivers 242, which can include a low-voltage level shifter, receive control signals CTRL. The low-voltage level shifter can compensate for differences between logic ground $G_{VSS}$ and power stage ground $G_{COM}$. However, the low-voltage level shifter may not be utilized in some implementations. For example, the low-voltage level shifter may not be utilized where logic ground $G_{VSS}$ and power stage ground $G_{COM}$ are part of a common ground.

In the present implementation, level shifted versions of control signals CTRL are received by U-phase driver 244b, V-phase driver 246b, and W-phase driver 248b. U-phase driver 244b, V-phase driver 246b, and W-phase driver 248b generate low side gate signals L1, L2, and L3 from control signals CTRL and provide low side gate signals L1, L2, and L3 to U-phase power switch 204b, V-phase power switch 206b, and W-phase power switch 208b, as shown in FIG. 2A. Thus, U-phase driver 244b, V-phase driver 246b, and W-phase driver 248b are low side drivers and are coupled to low side power switches of multi-phase power inverter 210. Low side gate signals L1, L2, and L3 in FIGS. 2A and 2B collectively correspond to low side drive signals LN in FIG. 1A.

In the present implementation, U-phase drivers 244a and 244b, V-phase drivers 246a and 246b, and W-phase drivers 248a and 248b are impedance matched to respective ones of U-phase power switches 204a and 204b, V-phase power switches 206a and 206b, and W-phase power switches 208a and 208b. U-phase drivers 244a and 244b, V-phase drivers 246a and 246b, and W-phase drivers 248a and 248b can thereby drive U-phase power switches 204a and 204b, V-phase power switches 206a and 206b, and W-phase power switches 208a and 208b without gate resistors which allows semiconductor package 200 to be smaller and less complex.

Common IC 202, and more particularly, driver circuit 214 can thereby drive switching of U-phase power switches 204a and 204b, V-phase power switches 206a and 206b, and W-phase power switches 208a and 208b using U-phase drivers 244a and 244b, V-phase drivers 246a and 246b, and W-phase drivers 248a and 248b to, for example, power load 262 (which is a motor, as one example).

As shown in FIG. 2C, load 262 is coupled to semiconductor package 200 and is configured to receive U-phase output 211a, V-phase output 211b, and W-phase output 211c respectively from SW1 terminal 352o, SW2 terminal 352p, and SW3 terminal 352q. In doing so, load 262 generates load current $I_L$, which is shown in FIG. 2A.

Referring to FIG. 2C, inverter front end 264 is configured to provide bus voltage VBUS to VBUS terminal 252a of semiconductor package 200 and supply voltage VCC to VCC terminal 252u of semiconductor package 200. In the present implementation, inverter front end 264 is an AC/DC front end and can include an input filter (e.g. an EMI filter) coupled to an AC to DC rectifier. The AC voltage can be, as one example, an outlet voltage, such as 230 volts. The DC voltage can be, for example, approximately 300 volts to approximately 400 volts for bus voltage VBUS and supply voltage VCC.

As can be seen in FIG. 2A, VBUS terminal 252a of semiconductor package 200 receives bus voltage VBUS, which is coupled to respective drains (and/or collectors in some implementations) of U-phase power switch 204a, V-phase power switch 206a, and W-phase power switch

208a. Bus voltage VBUS is thereby configured to power multi-phase power inverter 210.

Also in FIG. 2A, VCC terminal 252u of semiconductor package 200 is configured to receive supply voltage VCC, which is coupled to common IC 202. Supply voltage VCC is configured to power common IC 202. As shown in FIG. 2B, semiconductor package 200 may include voltage regulator 216, which is configured to receive supply voltage VCC. Voltage regulator 216 is for control circuit 212 and driver circuit 214 of semiconductor package 200. Thus, in some implementation, VCC terminal 252u can be a common supply voltage terminal for control circuit 212 and driver circuit 214. As shown, common IC 202 includes voltage regulator 216, which is configured to power control circuit 212 and driver circuit 214 of common IC 202. Voltage regulator 216 is configured to generate driver voltage V1, digital circuitry voltage V2, and analog circuitry voltage V3 from supply voltage VCC.

In the present implementation, diver voltage V1 is configured to power drivers of driver circuit 214, such as U-phase drivers 244a and 244b, V-phase drivers 246a and 246b, and W-phase drivers 248a and 248b. Driver voltage V1 can be, for example, approximately 15 volts. U-phase, V-phase, and W-phase drivers 244b, 246b, and 248b are coupled to driver voltage V1 whereas U-phase, V-phase, and W-phase drivers 244a, 246a, and 248a are coupled to respective bootstrap supply voltages VB1, VB2, and VB3.

VB1 terminal 252r, VB2 terminal 252s, and VB3 terminal 252t of semiconductor package 200 (shown in FIG. 2C) are configured to receive respective bootstrap supply voltages VB1, VB2, and VB3, which are coupled to common IC 202. Bootstrap supply voltages VB1, VB2, and VB3 are generated using bootstrap capacitors CB1, CB2, and CB3, bootstrap diodes in U-phase, V-phase, and W-phase drivers 244a, 246a, and 248a, and driver voltage V1. As shown in FIG. 2C, bootstrap capacitors CB1, CB2, and CB3 are respectively coupled to SW1 terminal 252o, SW2 terminal 252p, and SW3 terminal 252q and VB1 terminal 252r, VB2 terminal 252s, and VB3 terminal 252t. Voltage regulator 216, and more particularly driver voltage V1 is configured to charge bootstrap supply voltages VB1, VB2, and VB3 through the bootstrap diodes in U-phase driver 244a, V-phase driver 246a, and W-phase driver 248a.

Also in the present implementation digital circuitry voltage V2 is configured to power digital circuitry of common IC 202, which includes as examples, algorithm and control circuit 220, PWM circuit 222, dynamic current limiter 224, ADC 228, register 230, digital interface 232, and clock prescaler 240. Digital circuitry voltage V2 can be, for example, approximately 3.3 volts. By including digital circuitry that is configured to generate control signals CTRL, control circuit 212 offers robust control functionality.

Analog circuitry voltage V3 is configured to power analog circuitry of common IC 202, which includes as examples, pre-drivers 242, power on reset circuit 250, overcurrent sensing circuit 256, undervoltage and standby circuit 254, analog interface 226, crystal drive circuit 234, clock synthesis circuit 236, DCO 238, and clock prescaler 240. Analog circuitry voltage V3 can be, for example, approximately 3.3 volts.

Thus, common IC 202 includes voltage regulator 216, which is configured to power control circuit 212 and driver circuit 214 of common IC 202. Typical multi-phase power inverter circuits include voltage regulators as discrete components. However, by including voltage regulator 216 in semiconductor package 200, either internal or external to common IC 202, semiconductor package 200 can offer simplified circuit design, reduced cost, greater efficiency and improved performance, amongst other advantages.

In FIG. 2C, VSS terminal 252m of semiconductor package 200 is coupled to logic ground $G_{VSS}$ to receive logic ground VSS and VCOM terminal 252n of semiconductor package 200 is coupled to power stage ground $G_{COM}$ to receive power stage ground VCOM. FIGS. 2A and 2B further show that common IC 202 is configured to receive logic ground VSS and common IC 202 and multi-phase power inverter 210 are configured to receive power stage ground VCOM.

Logic ground VSS is a ground of a support logic circuit of common IC 202. The support logic circuit includes pre-drivers 242, undervoltage and standby circuit 254, power on reset circuit 250, overcurrent sensing circuit 256, and control circuit 212.

Power stage ground VCOM is a ground of U-phase power switches 204a and 204b, V-phase power switches 206a and 206b, and W-phase power switches 208a (i.e. of multi-phase power inverter 210). FIG. 2A shows power stage ground VCOM coupled to sources (and/or emitter is some implementations) of U-phase power switches 204a and 204b, V-phase power switches 206a and 206b, and W-phase power switches 208a and 208b within semiconductor package 200. Power stage ground VCOM can also be for common IC 202. For example, power stage ground VCOM is also coupled to U-phase, V-phase, and W-phase drivers 244b, 246b, and 248b of driver circuit 214 in the present implementation.

As shown in FIG. 2C, logic ground VSS being separate from power stage ground VCOM is provided for in multi-phase power inverter circuit 258 using shunt RS. Shunt RS is coupled across VSS terminal 252m and VCOM terminal 252n of semiconductor package 200. Thus, load current $I_L$ shown in FIG. 2A, from for example, load 262, is combined phase current from U-phase leg 282a, V-phase 282b, and W-phase leg 282c of multi-phase power inverter 210. U-phase leg 282a, V-phase 282b, and W-phase leg 282c correspond to a source/emitter of U-phase power switch 204b, V-phase power switch 206b, and W-phase power switch 208b respectively. Thus, in some implementations, control circuit 212 is configured to receive a combined phase current from a source/emitter of each of U-phase power switch 204b, V-phase power switch 206b, and W-phase power switch 208b (i.e. low side power switches). In closed loop implementations of multi-phase power inverter 258, such as in the present implementation, control circuit 212 utilizes load current $I_L$ to generate control signals CTRL. In open loop implementations, control circuit 212 may not utilize load current $I_L$ to generate control signal CTRL.

Thus, in the present implementation, semiconductor package 200 has logic ground VSS separate from power stage ground VCOM. During switching of U-phase power switches 204a and 204b, V-phase power switches 206a and 206b, and W-phase power switches 208a and 208b, a voltage can develop across shunt RS. By having logic ground VSS separate from power stage ground VCOM, supply voltage VCC for the support logic circuit can be made with respect to the logic ground instead of the voltage across shunt RS. Thus, by using separate grounds, semiconductor package 200 is protected from latch up and noise malfunction, which otherwise can be caused by excess switching voltages from U-phase power switches 204a and 204b, V-phase power switches 206a and 206b, and W-phase power switches 208a and 208b.

In other implementations, logic ground VSS is not separate from power stage ground VCOM and semiconductor package 200 instead has, for example, a single ground. For example, VSS terminal 252m and VCOM terminal 252n can be combined into a single terminal or can be shorted to one another. In one such implementation, semiconductor package 200 is an open source/emitter semiconductor package, in which load current from at least two of U-phase leg 282a, V-phase leg 282b, and W-phase leg 282c of multi-phase power inverter 210 are provided separately as opposed to load current $I_L$. Thus, for example, common IC 202 utilizes those respective load currents to generate control signals CTRL.

As described above, control circuit 212 can utilize load current $I_L$ to generate control signals CTRL. For example, control circuit 212 is configured to receive load current $I_L$ from overcurrent sensing circuit 256. Dynamic current limiter 224 is configured to receive load current $I_L$ from overcurrent sensing circuit 256 and is configured to provide load current $I_L$ to algorithm and control circuit 220.

In control circuit 212, algorithm and control circuit 220 is configured to control switching of multi-phase power inverter 210. In the present implementation, algorithm and control circuit 220 utilizes field-oriented control (FOC) based on load current $I_L$. Algorithm and control circuit 220 of control circuit 212 is configured to reconstruct at least two phase currents of multi-phase power inverter 210 from load current $I_L$, which is a combined phase current. The at least two phase currents that are reconstructed can correspond to phase current in any of U-phase leg 282a, V-phase 282b, and W-phase leg 282c. The FOC can be based on direct axis (d axis) and quadrature axis (q axis) coordinates of the phase current.

Algorithm and control circuit 220 is coupled to PWM circuit 222 and utilizes PWM circuit 222 to generate control signals CTRL, which are pulse width modulated control signals. In the present implementation, PWM circuit 222 is a space vector modulation circuit that is configured to generate control signals CTRL (by utilizing space vector modulation) as space vector modulated control signals. PWM circuit 222 is configured to generate control signals CTRL from volt second commands from algorithm and control circuit 220. PWM circuit 222 can perform two and/or three phase PWM. PWM circuit 222 may perform two phase PWM with approximately 20% lower loss than three phase PWM.

As show in FIG. 2B, driver circuit 214 includes undervoltage and standby circuit 254. Undervoltage and standby circuit 254 is coupled to voltage regulator 216 and can detect an undervoltage condition when supply voltage VCC falls below a threshold voltage. Undervoltage and standby circuit 254 is configured to notify dynamic current limiter 224 of the undervoltage condition and in response, dynamic current limiter 224 is configured to notify algorithm and control circuit 220 to disable switching of multi-phase power inverter 210.

Timing of the digital circuitry in common IC 202 is configured to be controlled by utilizing system clock $CLK_{SYS}$ and clock prescaler 240. System clock $CLK_{SYS}$ can have a frequency of, for example, approximately 10 MHz. In the present implementation, system clock $CLK_{SYS}$ is generated utilizing crystal drive circuit 234, clock synthesis circuit 236, and DCO 238. As shown in FIG. 2C, resistor R1 is coupled across XTAL terminal 252k and CLKIN terminal 252l and capacitor C1 is coupled to CLKIN terminal 252l and logic ground $G_{VSS}$ so as to set timing of system clock $CLK_{SYS}$. Crystal drive circuit 234 is configured to receive XTAL signal and CLKIN signal from XTAL terminal 252k and CLKIN terminal 252l.

Semiconductor package 200 is configured to disable switching of multi-phase power inverter 210 responsive to power on reset circuit 250. Power on reset circuit 250 is configured to force reset of the digital circuitry in control circuit 212 during power on until various circuitry in common IC 202 is prepared for stable operation. For example, power on reset circuit 250 can provide a reset signal to dynamic current limiter 224 and dynamic current limiter 224 can notify algorithm and control circuit 220 to disable switching of multi-phase power inverter 210.

Dynamic current limiter 224 is coupled to overcurrent sensing circuit 256 and is configured to provide overcurrent protection to multi-phase power inverter 210 utilizing overcurrent information (e.g. a voltage) received from overcurrent sensing circuit 256. For example, if the overcurrent information exceeds a threshold value dynamic current limiter 224 can notify algorithm and control circuit 220 to disable switching of multi-phase power inverter 210. When the overcurrent information no longer exceeds the threshold value, switching of multi-phase power inverter 210 can resume.

In the present implementation, dynamic current limiter 224 is also an over-temperature protection circuit and is also referred to as over-temperature protection circuit 224. Driver circuit 214 and control circuit 112 are on common IC 202 with over-temperature protection circuit 224. Over-temperature protection circuit 224 is configured to provide over-temperature protection to multi-phase power inverter 210 using a sensed temperature. The sensed temperature, which can correspond to $TEMP_S$ in FIG. 1A, can be from analog interface 226 and/or ADC 228. As shown in FIG. 2B, common IC 202 includes temperature sensor 209, corresponding to temperature sensor 109 in FIG. 1A. In the present implementation, dynamic current limiter 224 is configured to receive sensed temperature $TEMP_S$ from temperature sensor 209.

In the present implementation, temperature sensor 209 is a thermistor. Temperature sensor 209 utilizes diode DT to generate sensed temperature $TEMP_S$. As one example, temperature sensor 209 is a negative temperature coefficient diode type thermistor. However, other types of temperature sensors can be utilized. In some implementation, ADC 228 is configured to digitize sensed temperature $TEMP_S$ and provide the digitized sensed temperature $TEMP_S$ to over-temperature protection circuit 224. Also in some implementations, over-temperature protection circuit 224 receives sensed temperature $TEMP_S$ in analog form. Furthermore, dynamic current limiter 224 may include an analog to digital converter dedicated to digitizing sensed temperature $TEMP_S$ so as to improve its accuracy and speed.

By including temperature sensor 209, semiconductor package 200 can simplify circuit design, reduce costs, and provide greater efficiency and improved performance to a multi-phase power inverter circuit. Furthermore, temperature sensor 209 can be placed much closer to driver circuit 214, control circuit 212, and/or power switches of multi-phase power inverter 210, providing highly accurate and fast temperature sensing.

In the present implementation, temperature sensor 209 is on common IC 202 with driver circuit 214 and/or control circuit 212. Temperature sensor 209 is also on common IC 202 with over-temperature protection circuit 224, which is included in control circuit 212 in the present implementation. In many cases temperature sensor 209 cannot be included on common IC 202 as temperature sensor 209 would be too far from power switches of multi-phase power inverter 210 for proper temperature measurement. However, as semiconductor package 200 is highly compact and thermally consistent, temperature sensor 209 can be in common IC 202 while still providing accurate sensed temperature $TEMP_S$. For example, in the present implementation, temperature sensor 209 is within approximately 3 millimeters of each of the power switches of multi-phase power inverter 210. This can further increase the accuracy and speed of the temperature sensing. Also, including temperature sensor 209 in common IC 202 simplifies circuit design, reduces costs, and allows for semiconductor package 200 to be made smaller. For example, in some implementations, semiconductor package 200 achieves a footprint of approximately 12 mm by approximately 12 mm. In other implementations, semiconductor package 200 can have a footprint of greater than 12 mm by 12 mm. In still other implementations, semiconductor package 200 can have a footprint of less than 12 mm by 12 mm.

Typical over-temperature protection circuits must utilize a single temperature threshold value of power switches as temperature sensing for those circuits are not sufficiently fast and accurate so as to allow for more granular temperature sensing. However, over-temperature protection circuit 224 is configured to reduce current through power switches 207 based on multiple temperature threshold values of power switches 207 and sensed temperature $TEMP_S$ of power switches 207.

Over-temperature protection circuit 224 is configured to notify algorithm and control circuit 220 if sensed temperature $TEMP_S$ from temperature sensor 209 exceeds a reference value so as to disable or otherwise alter switching of multi-phase power inverter 210. Analog interface 226 can provide sensed temperature $TEMP_S$ from temperature sensor 209 to ADC 228. ADC 228 can generate digitized sensed temperature $TEMP_S$ from analog sensed temperature $TEMP_S$ and can provide the digitized sensed temperature $TEMP_S$ to over-temperature protection circuit 224. Over-temperature protection circuit 224 is configured to compare the digitized sensed temperature $TEMP_S$ to any of the multiple temperature threshold values. It is noted that in some implementations sensed temperature $TEMP_S$ can remain analog in over-temperature protection circuit 224.

In the implementation shown, dynamic current limiter 224 is configured to provide over-temperature protection to multi-phase power inverter 210 utilizing three temperature threshold values (e.g. temperature values) of power switches 207. The three temperature threshold values correspond to temperature threshold values T1, T2, and T3 in FIG. 1B and define ranges of temperature threshold values for different over-temperature protection modes, which correspond to modes 117a, 117b, and 117c in FIG. 1B.

In a first range of temperature threshold vales, for example from approximately 100 degrees Celsius to approximately 220 degrees Celsius, algorithm and control circuit 220 is configured to disable switching of U-phase power switch 204a, V-phase power switch 206a, and W-phase power switch 208a (e.g. to disable high side switching). The switching is disabled responsive to a notification from dynamic current limiter 224. However, switching of U-phase power switch 204b, V-phase power switch 206b, and W-phase power switch 208b is maintained. Thus, load current $I_L$ can correspond to residue current from load 262 through U-phase power switch 204b, V-phase power switch 206b, and W-phase power switch 208b.

In a second range of temperature threshold vales, for example from approximately 220 degrees Celsius to approximately 240 degrees Celsius, algorithm and control circuit 220 is configured to periodically disable switching of multi-phase power inverter 210, for example, for at least one PWM cycle, which may utilize zero vectors. As a specific example, for a 10 KHz carrier frequency, switching can be periodically disabled for a 100 ms period. The periodic disabling is responsive to a notification from dynamic current limiter 224.

In a third range of temperature threshold vales, for example at approximately 240 degrees Celsius or greater, algorithm and control circuit 220 is configured to completely disable switching of multi-phase power inverter 210. The complete disabling is responsive to a notification from dynamic current limiter 224.

Thus, the multiple temperature threshold values define ranges of temperature threshold values for different over-temperature protection modes for over-temperature protection circuit 224. The multiple modes of over-temperature protection increasingly limit current in multi-phase power inverter 210 as the multiple temperature threshold values increase. Dynamic current limiter 224 is thereby configured to increasingly limit current in multi-phase power inverter 210 as the sensed temperature of multi-phase power inverter 210 increases and similarly decreasingly limit current in multi-phase power inverter 210 as the sensed temperature of multi-phase power inverter 210 decreases.

Now Referring to FIG. 2B with FIG. 2C, host 260 is configured to provide VSP to VSP terminal 252b. Common IC 202 (control circuit 212) is configured to receive VSP from VSP terminal 252b. Control circuit 212 is configured to utilize VSP to set the speed of load 262, which can be a motor. For example, VSP is an analog voltage command and can be from an analog potential meter, as one example.

Host 260 is further configured to provide AADV to AADV terminal 252c. Common IC 202 (control circuit 212) is configured to receive AADV from AADV terminal 252c. Control circuit 212 is configured to utilize AADV to change an angle relationship between load 262 and the phase current versus voltage command. This can increase the efficiency of load 262.

Host 260 is also configured to receive PG from PG terminal 252d and to provide PGSEL to PGSEL terminal 252f. Common IC 202 (control circuit 212) is configured to provide PG to PG terminal 252d and to receive PGSEL from PGSEL terminal 252f. PG can include pulses that are proportional to the speed of load 262 so as to indicate the speed of load 262 to host 260 and/or another circuit. Common IC 202 (control circuit 212) is configured to select how many pulses are in PG per revolution. For example, common IC 202 can utilize PGSEL to select between eight and twelve pulses per revolution.

Host 260 is additionally configured to provide DIR to DIR terminal 252e. Common IC 202 (e.g. control circuit 212) is configured to receive DIR from DIR terminal 252e. Control circuit 212 is configured to utilize DIR to select a direction for load 262 (e.g. a motor).

Host 260 is further configured to provide PAR1 to PAR1 terminal 252g and PAR2 to PAR2 terminal 252h. Common IC 202 (e.g. control circuit 212) is configured to receive PAR1 from PAR1 terminal 252g and PAR2 from PAR2 terminal 252h. Control circuit 212 is configured to utilize PAR1 and PAR2 to adjust algorithm and control circuit 220 so as to accommodate different types of loads for load 262 (e.g. different types of motors). This can account for loads having differing Ke, Kt, poll numbers, and/or other characteristics.

Host 260 is also configured to receive TX from TX terminal 252j and to provide RX to RX terminal 252i. Common IC 202 (e.g. control circuit 212) is configured to provide TX to TX terminal 252*j* and to receive RX from RX terminal 252*i*. Utilizing RX, TX, digital interface 232, and register 230, control circuit 212 can digitally communicate with, for example, host 260. In the present implementation, digital interface 232 includes a universal asynchronous receiver/transmitter (UART).

It will be appreciated that in various implementations, the number, quantity, and location of I/O terminals 252 are different than what is shown. For example, in various implementations, a common IC that is different than common IC 202 can be utilized, which can have different capabilities and/or I/O requirements than common IC 202. This may be reflected in I/O terminals 252 as well as other connections of semiconductor package 200. For example, while the present implementation shows a single shunt implementation, as discussed above, in other implementations semiconductor package 200 is an open source/emitter package. Furthermore, control circuit 212 and driver circuit 214 may be on separate ICs in some implementations, which can impact I/O terminals 252. As another example, in some implementations, XTAL and CLKIN are generated within semiconductor package 200 (and/or control circuit 212) and semiconductor package 200 does not include XTAL terminal 252*k* and CLKIN terminal 252*l*. As yet another example, temperature sensor 209 and/or over-temperature protection circuit 224 may be included in semiconductor package 200, but may not be on common IC 202.

Figure 3A:
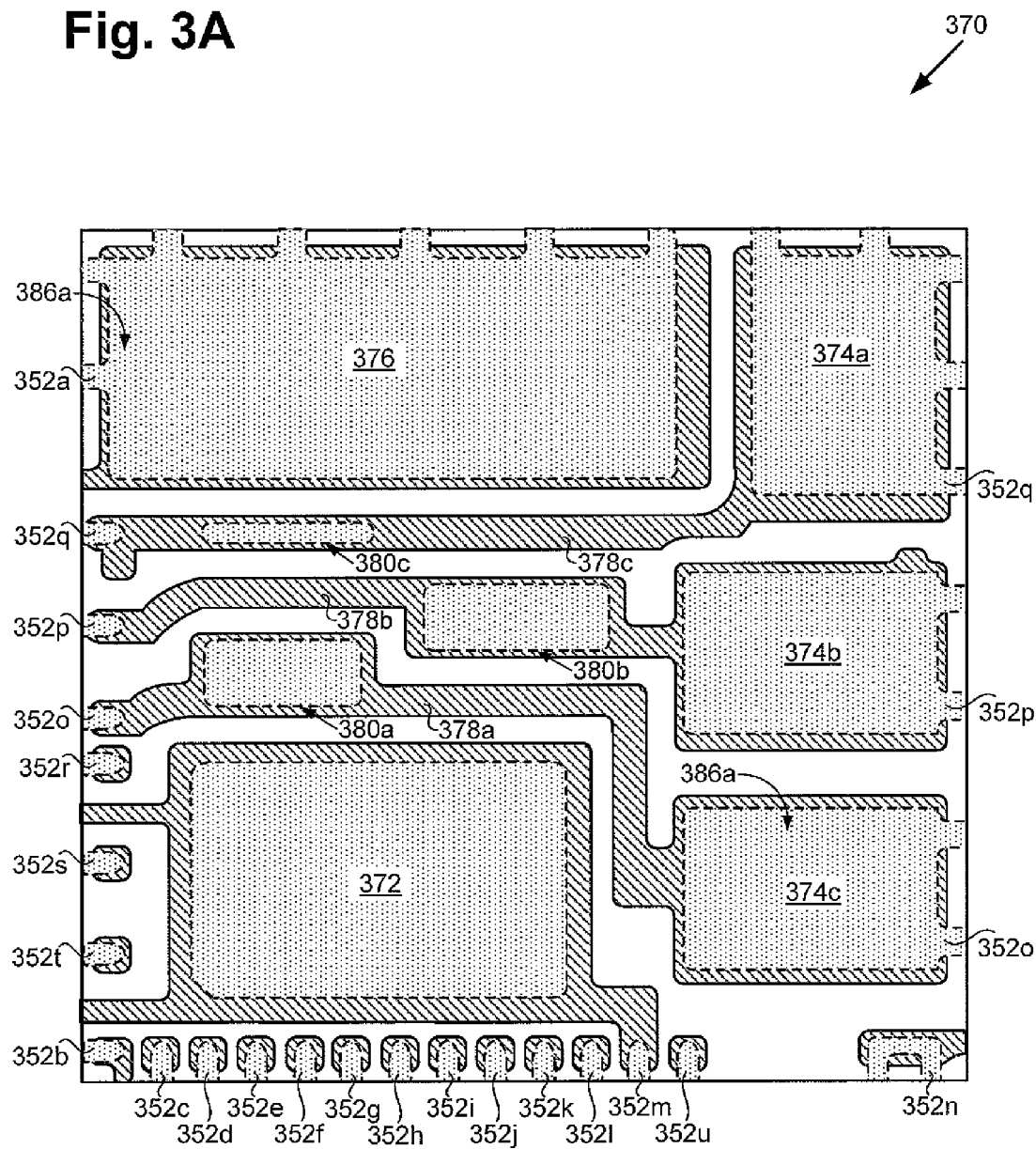
FIG. 3A illustrates a top-plan view of a leadframe of an exemplary semiconductor package.
Figure 3B:
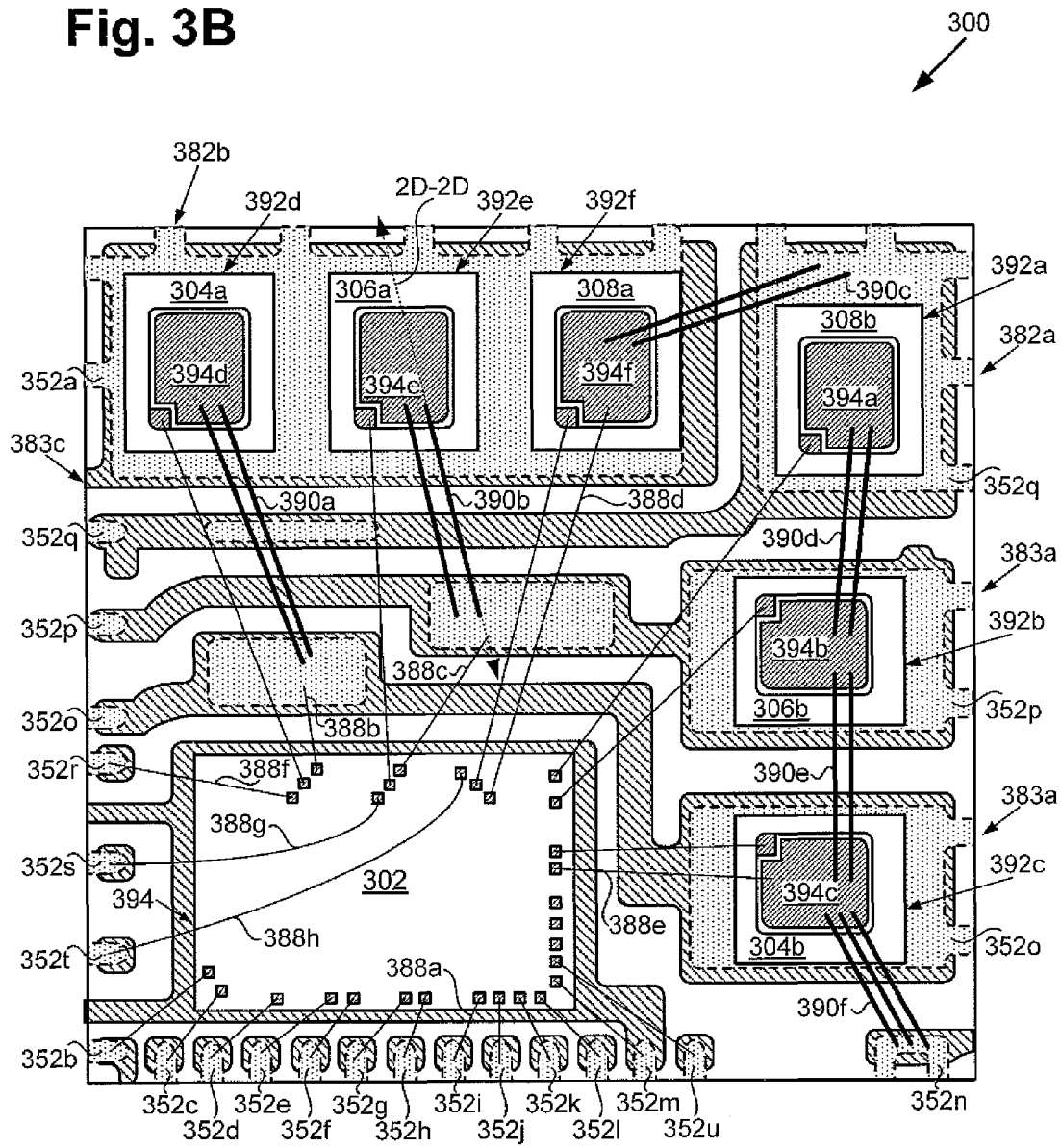
FIG. 3B illustrates a top-plan view of an exemplary semiconductor package with wirebonds.
Figure 3C:
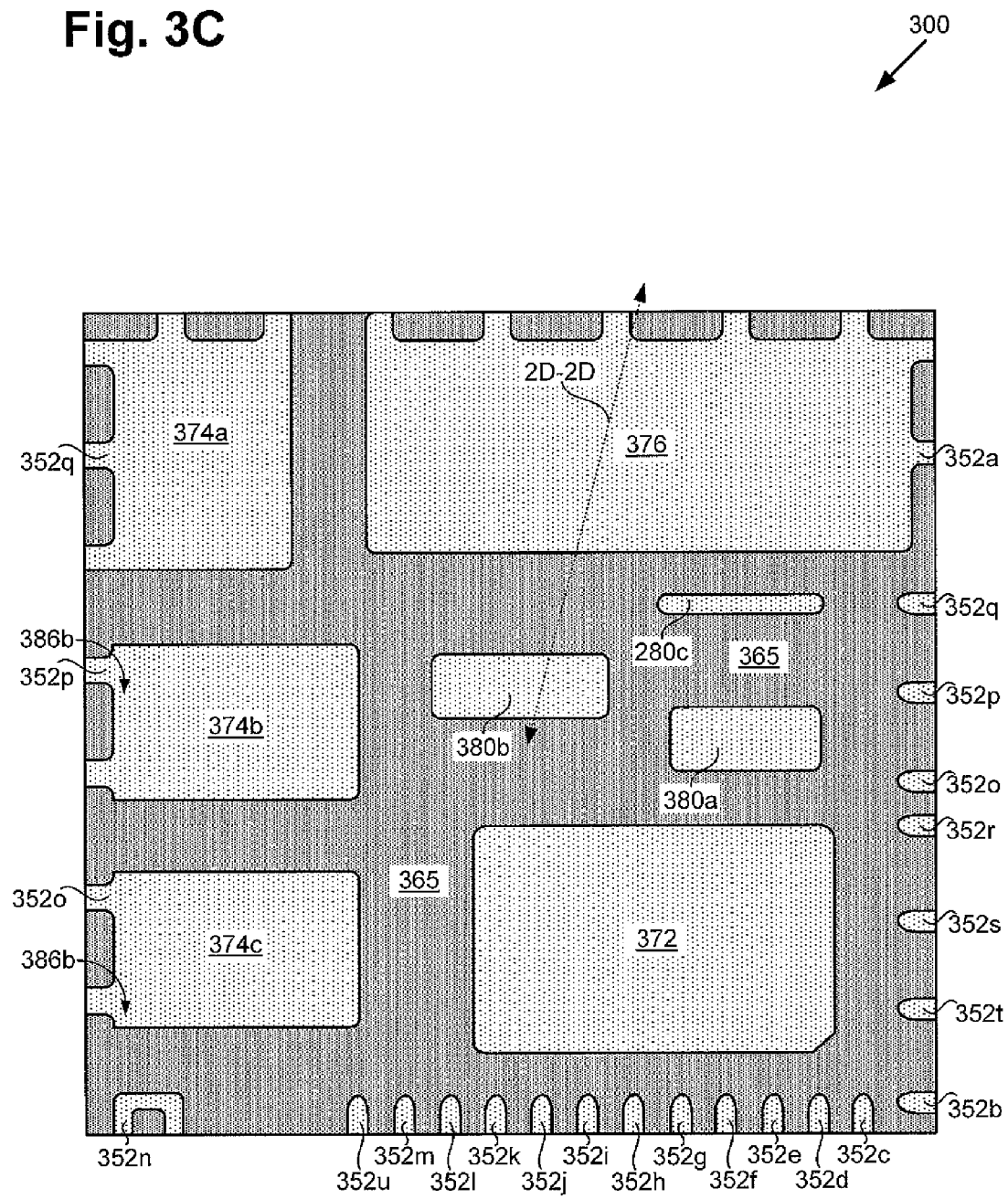
FIG. 3C illustrates a bottom-plan view of an exemplary semiconductor package.

Thus, semiconductor package 200 includes over-temperature protection circuit 224 configured to reduce current through power switches 207 based on multiple temperature threshold values of power switches 207 and a sensed temperature of power switches 207. FIGS. 3A, 3B, and 3C illustrate one specific example by with over-temperature protection circuit 224 can be included in a semiconductor package.

Turning to FIGS. 3A, 3B, and 3C, FIG. 3A illustrates a top-plan view of leadframe 370 of semiconductor package 300 of FIGS. 3B and 3C. FIG. 3B illustrates a top-plan view of semiconductor package 300. FIG. 3C illustrates a bottom-plan view of semiconductor package 300. In the present implementation, semiconductor package 300 is a multi-chip module (MCM) power quad flat no-lead (PQFN) package, which can have a footprint of approximately 12 mm by approximately 12 mm. In other implementations, semiconductor package 300 is a multi-chip module (MCM) power quad flat no-lead (PQFN) package, which can have a footprint of greater than 12 mm by 12 mm or less than 12 mm by 12 mm.

Semiconductor package 300 corresponds to semiconductor package 200 in FIGS. 2A, 2B, and 2C. For example, semiconductor package 300 includes common IC 302, U-phase power switches 304*a* and 304*b*, V-phase power switches 306*a* and 306*b*, and W-phase power switches 308*a* and 308*b* corresponding respectively to common IC 202, U-phase power switches 204*a* and 204*b*, V-phase power switches 206*a* and 206*b*, and W-phase power switches 208*a* and 208*b* in FIG. 2A.

Furthermore, semiconductor package 300 includes VBUS terminal 352*a*, VSP terminal 352*b*, AADV terminal 352*c*, PG terminal 352*d*, DIR terminal 352*e*, PGSEL terminal 352*f*, PAR1 terminal 352*g*, PAR2 terminal 352*h*, RX terminal 352*i*, TX terminal 352*j*, XTAL terminal, 352*k*, CLK terminal 352*l*, VSS terminal 352*m*, VCOM terminal 352*n*, SW1 terminals 352*o*, SW2 terminals 352*p*, SW3 terminals 352*q*, VB1 terminal 352*r*, VB2 terminal 352*s*, VB3 terminal 352*t*, and VCC terminal 352*u* (also referred to as "I/O terminals 352") corresponding respectively to VBUS terminal 252*a*, VSP terminal 252*b*, AADV terminal 252*c*, PG terminal 252*d*, DIR terminal 252*e*, PGSEL terminal 252*f*, PAR1 terminal 252*g*, PAR2 terminal 252*h*, RX terminal 252*i*, TX terminal 252*j*, XTAL terminal 252*k*, CLKIN terminal 252*l*, VSS terminal 252*m*, VCOM terminal 252*n*, SW1 terminal 252*o*, SW2 terminal 252*p*, SW3 terminal 252*q*, VB1 terminal 252*r*, VB2 terminal 252*s*, VB3 terminal 252*t*, and VCC terminal 252*u* of semiconductor package 200.

FIG. 3A shows leadframe 370 corresponding to leadframe 170 in FIG. 1A. Leadframe 370 includes common IC pad 372, W-phase output pad 374*a*, V-phase output pad 374*b*, U-phase output pad 374*c*, and common drain/collector pad 376. leadframe 370 further includes U-phase, V-phase, and W-phase output strips 378*a*, 378*b*, and 378*c*. Leadframe island 380*a* is situated on U-phase output strip 378*a* of leadframe 370, leadframe island 380*b* is situated on V-phase output strip 378*b* of leadframe 370, and leadframe island 380*c* is situated on W-phase output strip 378*c* of leadframe 370.

U-phase output strip 378*a* is electrically and mechanically connected (e.g. integrally connected) to U-phase output pad 374*c* of leadframe 370 and to SW1 terminals 352*o*. V-phase output strip 378*b* is electrically and mechanically connected (e.g. integrally connected) to V-phase output pad 374*b* of leadframe 370 and to SW2 terminals 352*p*. Also, W-phase output strip 378*c* is electrically and mechanically connected (e.g. integrally connected) to W-phase output pad 374*a* of leadframe 370 and to SW3 terminals 352*q*.

As shown in FIG. 3B, U-phase output strip 378*a*, V-phase output strip 378*b*, and W-phase output strip 378*c* can optionally substantially traverse across leadframe 370. For example, U-phase output strip 378*a*, V-phase output strip 378*b*, and W-phase output strip 378*c* extend respectively from U-phase output pad 374*c*, V-phase output pad 374*b*, and W-phase output pad 374*a* to edge 383*c* of semiconductor package 300. In doing so, any of U-phase output strip 378*a*, V-phase output strip 378*b*, and W-phase output strip 378*c* can provide, for example, additional I/O terminals 352 for semiconductor package 300. For example, U-phase output strip 378*a* is shown as providing an additional SW1 terminal 352*o* at edge 383*c* of semiconductor package 300.

In the present implementation, leadframe 370 is a PQFN leadframe. Leadframe 370 can include a material with high thermal and electrical conductivity such as copper (Cu) alloy C194 available from Olin Brass®. Top-side 386*a* of leadframe 370 can be selectively plated with materials for enhanced adhesion to device dies and wires. The plating can include silver (Ag) plating that is selectively applied to leadframe 370, which is available from companies such as QPL Limited.

FIGS. 3A and 3B show that leadframe 370 is an etched leadframe, such as a half-etched leadframe. Portions of leadframe 370, which are unetched (e.g. not half-etched) are indicated in FIGS. 3A and 3B using dashed lines. Leadframe islands 380*a*, 380*b*, and 380*c* are examples of such unetched portions. For example, FIG. 3C shows bottom-side 386*b* of leadframe 370 (which also corresponds to a bottom-side of semiconductor package 300). FIG. 3C further shows mold compound 365 of semiconductor package 300, which covers etched portions of leadframe 370. Mold compound 365 can be a plastic that has a low flexural modulus, such as CEL9220ZHF10 (v79) available from Hitachi® Chemical. To provide resilience against package cracking, the height (or thickness) of semiconductor package 300 as defined by mold compound 365 may be kept thin, such as 0.9 mm or less.

I/O terminals 352, leadframe islands 380a, 380b, and 380c are unetched and are exposed through mold compound 365 on bottom-side 386b of leadframe 370 (which also corresponds to a bottom-side of semiconductor package 300). As such, I/O terminals 352 and leadframe islands 380a, 380b, and 380c are exposed on bottom-side 386b of leadframe 370 for high electrical conductivity and/or thermal dissipation. Portions of common IC pad 372, common drain/collector pad 376, W-phase output pad 374a, V-phase output pad 374b, and U-phase output pad 374c are also exposed on bottom-side 386b of semiconductor package 300 for high electrical conductivity and/or thermal dissipation. By providing, for example, a (PCB) with matching lands, the exposed features can optionally be exploited. The exposed areas of leadframe 370 can be plated, for example, with Tin (Sn) or another metal or metal alloy.

In the present implementation, control circuit 212 and driver circuit 214 of FIG. 2B are in common IC 302. Over-temperature protection circuit 224 is in control circuit 212. Thus, control circuit 212 and driver circuit 214 are on common IC 302 with over-temperature protection circuit 224. Furthermore, common IC 202 includes temperature sensor 209 that is configured to generate sensed temperature TEMP$_S$ of U-phase power switches 304a and 304b, V-phase power switches 306a and 306b, and W-phase power switches 308a and 308b.

Common IC 302 is situated on leadframe 370 and more particularly, common IC 302 is situated on common IC pad 372 of leadframe 370. Thus, in the present implementation, driver circuit 214 and control circuit 212 are situated on a common pad of leadframe 370. Furthermore, temperature sensor 209 and over-temperature protection circuit 224 are situated on the common pad of leadframe 370 with driver circuit 214 and control circuit 212.

Common IC 302, U-phase power switches 304a and 304b, V-phase power switches 306a and 306b, and W-phase power switches 308a and 308b are interconnected utilizing wirebonds and leadframe 370. It is noted that any particular connection shown can utilize one or more wirebonds.

FIG. 3B shows that wirebonds, such as wirebond 388a electrically and mechanically connect common IC 302 to VSP terminal 352b, AADV terminal 352c, PG terminal 352d, DIR terminal 352e, PGSEL terminal 352f, PAR1 terminal 352g, PAR2 terminal 352h, RX terminal 352i, TX terminal 352j, XTAL terminal, 352k, CLK terminal 352l, VSS terminal 352m, and VCC terminal 352u, and to respective gates of U-phase power switches 304a and 304b, V-phase power switches 306a and 306b, and W-phase power switches 308a and 308b. The wirebonds can thereby connect driver circuit 214, shown in FIG. 2B, to multi-phase power inverter 210, shown in FIG. 2A.

Wirebond 388a and similarly depicted wirebonds in FIG. 3B can include, for example, 1.3 mil diameter G1 type Gold (Au) wires. Thicker wires can be utilized for power connections, such as wirebonds 390a, 390b, 390c, 390d, 390e, and 390f (also referred to as "wirebonds 390"). Wirebonds 390 can be, for example, 2.0 mil diameter copper (Cu) wires, such as Maxsoft® LD wires available from Kulicke & Soffa®. Wirebonds 390 can be bonded using bond stitch on ball (BSOB) bonding. As shown in FIG. 3B, multiple wirebonds, such as two wirebonds, can be in parallel with wirebonds 390 to for additional current handling.

FIG. 3B shows that U-phase power switches 304a and 304b, V-phase power switches 306a and 306b, W-phase power switches 308a and 308b, and common IC 302 are electrically and mechanically connected to leadframe 370. This can be accomplished utilizing solder or conductive adhesive, such as silver filled QMI 529HT available from Henkel Corporation.

As shown in FIG. 3B, U-phase power switch 304b, V-phase power switch 306b, and W-phase power switch 308b are situated on leadframe 370 along edge 383a of semiconductor package 300. W-phase power switch 308b is situated on W-phase output pad 374a. More particularly, drain 392a of W-phase power switch 308b is situated on W-phase output pad 374a. Similarly, V-phase power switch 306b is situated on V-phase output pad 374b. More particularly, drain 392b of V-phase power switch 306b is situated on V-phase output pad 374b. Also, U-phase power switch 304b is situated on U-phase output pad 374c. More particularly, drain 392c of U-phase power switch 304b is situated on U-phase output pad 374c. Thus, U-phase power switch 304b, V-phase power switch 306b, and W-phase power switch 308b are individually coupled to respective die pads of leadframe 370. As such, W-phase output pad 374a can correspond to SW3 terminal 352q of semiconductor package 300, V-phase output pad 374b can correspond to SW2 terminal 352p of semiconductor package 300, and U-phase output pad 374c can correspond to SW1 terminal 352o of semiconductor package 300, as shown in FIG. 3B.

Also shown in FIG. 3B, U-phase power switch 304a, V-phase power switch 306a, and W-phase power switch 308a are situated on leadframe 370 along edge 383b of semiconductor package 300, which intersects edge 383a. U-phase power switch 304a, V-phase power switch 306a, and W-phase power switch 308a are situated on common drain/collector pad 376 of leadframe 370. More particularly, drain 392d of U-phase power switch 304a, drain 392e of V-phase power switch 306a, and drain 392f of W-phase power switch 308a are situated on common drain/collector pad 376 of leadframe 370. Thus, common drain/collector pad 376 can correspond to VBUS terminal 352a of semiconductor package 300, as shown in FIG. 3B.

Drain 392d of U-phase power switch 304a, drain 392e of V-phase power switch 306a, and drain 392f of W-phase power switch 308a can be connected to common drain/collector pad 376 through conductive adhesive and/or plating of leadframe 370. The conductive adhesive can include silver filled adhesive such as QMI 529HT. Other dies in semiconductor package 300 can similarly be connected to leadframe 370.

U-phase power switch 304b, V-phase power switch 306b, and W-phase power switch 308b are coupled respectively to U-phase power switch 304a, V-phase power switch 306a, and W-phase power switch 308a through leadframe 370.

As shown in FIG. 3B, U-phase, V-phase, and W-phase power switches 304b, 306b, and 308b are each situated on leadframe 370 and are also respectively connected to U-phase, V-phase, and W-phase output pads 374c, 374b, and 374a. U-phase, V-phase, and W-phase power switches 304b, 306b, and 308b are also respectively connected to U-phase, V-phase, and W-phase output strips 378a, 378b, and 378c through U-phase, V-phase, and W-phase output pads 374c, 374b, and 374a.

In FIG. 3B, wirebond 390a electrically and mechanically connects source 394d of U-phase power switch 304a to leadframe 370. Source 394d is connected via wirebond 390a to leadframe island 380a of U-phase output strip 378a through, for example, plating of leadframe 370. U-phase output strip 378a then connects to drain 392c of U-phase power switch 304b through U-phase output pad 374c. Thus, source 394d is connected via wirebond 390a to leadframe island 380a of U-phase output strip 378a. As such, U-phase output 211*a* of FIG. 2A is connected to U-phase output strip 378*a* of leadframe 370, where U-phase output strip 378*a* is connected to U-phase output pad 374*c* of leadframe 370. By doing so, semiconductor package 300 has significant flexibility in arranging wirebond 390*a*, and other wirebonds, such as wirebond 388*b*, while avoiding wire shorts due to wire crossing and achieving high electrical and thermal performance.

Similarly, wirebond 390*b* electrically and mechanically connects source 394*e* of V-phase power switch 306*a* to leadframe 370. Source 394*e* is connected via wirebond 390*b* to leadframe island 380*b* of V-phase output strip 378*b* through, for example, plating of leadframe 370. V-phase output strip 378*b* then connects to drain 392*b* of V-phase power switch 306*b* through V-phase output pad 374*b*. Thus, V-phase output 211*b* of FIG. 2A is connected to V-phase output strip 378*b* of leadframe 370, where V-phase output strip 378*b* is connected to V-phase output pad 374*b* of leadframe 370. As such, semiconductor package 300 has significant flexibility in arranging wirebond 390*b*, and other wirebonds, such as wirebond 388*c*, while avoiding wire shorts due to wire crossing and achieving high electrical and thermal performance.

Also in FIG. 3B, wirebond 390*c* is electrically and mechanically connecting source 394*f* of W-phase power switch 308*a* to leadframe 370. More particularly, wirebond 390*c* electrically and mechanically connects source 394*f* of W-phase power switch 308*a* to W-phase output pad 374*a* on leadframe 370. Thus, W-phase output 211*c* of FIG. 2A is connected to W-phase output pad 374*a* of leadframe 370 with W-phase power switch 308*b*. As W-phase power switch 308*b* is adjacent to W-phase power switch 308*a*, source 394*f* of W-phase power switch 308*a* can be coupled to drain 392*a* of W-phase power switch 308*b* while easily avoiding wire shorts due to wire crossing and achieving high electrical and thermal performance.

Thus, multi-phase power inverter 210 of FIG. 2A can be included in common IC 302. Multi-phase power inverter 210 includes U-phase output 211*a* connected to U-phase output strip 378*a* and U-phase output pad 374*c* using at least wirebond 388*b*. Furthermore, multi-phase power inverter 210 includes V-phase output 211*b* connected to V-phase output strip 378*b* and V-phase output pad 374*b* using at least wirebond 388*c*. Multi-phase power inverter 210 also includes W-phase output 211*c* connected to W-phase output strip 378*c* and W-phase output pad 374*a* using at least wirebond 388*d*.

The aforementioned can be accomplished without utilizing W-phase output strip 378*c* and/or leadframe island 380*c*. However, by utilizing W-phase output strip 378*c*, an additional SW3 terminal 352*q* can be provided at edge 383*c* of semiconductor package 300. Furthermore, leadframe island 380*c* can be exposed on bottom-side 386*b* of semiconductor package 300 for high electrical conductivity and/or thermal dissipation. This configuration does not significantly impact flexibility in arranging wirebonds in semiconductor package 300.

Also in semiconductor package 300, common IC 302 is connected to U-phase output strip 378*a*, V-phase output strip 378*b*, and W-phase output strip 378*c* of leadframe 370. Common IC 302 is connected to U-phase output strip 378*a* and V-phase output strip 378*b* through respective wirebonds 388*b* and 388*c*. Furthermore, common IC 302 is connected to W-phase output strip 378*c* through wirebonds 388*d*, 390*c*, and W-phase output pad 374*a*.

Common IC 302 is also connected to U-phase output pad 374*c*, V-phase output pad 374*b*, and W-phase output pad 374*a* of leadframe 370. Common IC 302 is connected to U-phase output pad 374*c* through wirebond 388*b* and U-phase output strip 378*a*. Furthermore, common IC 302 is connected to V-phase output pad 374*b* through wirebond 388*c* and V-phase output strip 378*b*. Common IC 302 is connected to W-phase output pad 374*a* through wirebonds 388*d* and 390*c*.

In semiconductor package 300, wirebond 388*b* couples driver circuit 214 (e.g. U-phase driver 244*a*) and U-phase output strip 378*a* of leadframe 370 at leadframe island 380*a*. U-phase output 211*a* of FIG. 2A is situated on leadframe island 380*a* of leadframe 370. Thus, U-phase driver 244*a* of FIG. 2A is coupled to U-phase output 211*a* of multi-phase power inverter 210, where U-phase output 211*a* is situated on leadframe island 380*a* (and/or U-phase output strip 378*a*) of leadframe 370.

Similarly, wirebond 388*c* couples driver circuit 214 (e.g. V-phase driver 246*a*) and V-phase output strip 378*b* of leadframe 370 at leadframe island 380*b*. V-phase output 211*b* of FIG. 2A is situated on leadframe island 380*b* of leadframe 370. Thus, V-phase driver 246*a* of FIG. 2A is coupled to V-phase output 211*b* of multi-phase power inverter 210, where V-phase output 211*b* is situated on leadframe island 380*b* (and/or V-phase output strip 378*b*) of leadframe 370.

It is noted that semiconductor package 300 can include leadframe islands 380*a*, 380*b*, and/or 380*c* without U-phase, V-phase, and W-phase output strips 378*a*, 378*b*, and/or 378*c*. For example, leadframe island 380*b* can be connected to V-phase output pad 374*b* through a trace on a PCB. It is further noted that semiconductor package 300 can include U-phase, V-phase, and W-phase output strips 378*a*, 378*b*, and/or 378*c* without leadframe islands 380*a*, 380*b*, and/or 380*c*. However, having U-phase, V-phase, and W-phase output strips 378*a*, 378*b*, and 378*c* with leadframe islands 380*a*, 380*b*, and 380*c* can offer significant flexibility in arranging wirebonds in semiconductor package 300 while achieving high electrical and thermal performance.

Also in the present implementation, wirebond 388*d* couples driver circuit 214 (e.g. W-phase driver 248*a*) and source 394*f* of W-phase power switch 308*a*. Wirebond 388*d* is a direct electrical connection between common IC 302 and source 394*f*. W-phase driver 248*a* of FIG. 2A is thereby coupled to W-phase output 211*c* of multi-phase power inverter 210. It is noted that in some implementations, wirebond 388*b* can couple driver circuit 214 (e.g. W-phase driver 248*a*) and W-phase output strip 378*c* of leadframe 370 at leadframe island 380*c*. However, this may increase the footprint of semiconductor package 300.

Semiconductor package 300 further includes wirebonds 388*f*, 388*g*, and 388*h* respectively coupling the common IC (e.g. driver circuit 214) to VB1, VB2, and VB3 terminals 352*r*, 352*s*, and 352*t* of semiconductor package 300. Bootstrap capacitors can be respectively coupled from VB1, VB2, and VB3 terminals 352*r*, 352*s*, and 352*t* to SW1 terminal 352*o*, SW2 terminal 352*p*, and SW3 terminal 352*q* so as to power U-phase, V-phase, and W-phase drivers 244*a*, 246*a*, and 248*a*.

Semiconductor package 300 includes a logic ground of leadframe 370 coupled to a support logic circuit of common IC 302. The logic ground of leadframe 370 includes VSS terminal 352*m*. At least wirebond is electrically and mechanically connecting VSS terminal 352*m* of leadframe 370 to common IC 302 and more particularly, is connecting VSS terminal 352*m* of leadframe 370 to the support logic of common IC 302.

Semiconductor package 300 further includes a power stage ground of leadframe 370 coupled to sources 394c, 394b, and 394a of U-phase power switch 304b, V-phase power switch 306b, and W-phase power switch 308b. The power stage ground of leadframe 370 includes VCOM terminal 352n. In FIG. 3B, at least wirebond 390f is electrically and mechanically connecting VCOM terminal 352n of the power stage ground of leadframe 370 to source 394c of U-phase power switch 304b. At least wirebond 390e is electrically and mechanically connecting source 394c of U-phase power switch 304b to source 394b of V-phase power switch 306b. Also, at least wirebond 390d is electrically and mechanically connecting source 394b of V-phase power switch 306b to source 394a of W-phase power switch 308b. Thus, sources 394a, 394b, and 394c of U-phase power switch 304b, V-phase power switch 306b, and W-phase power switch 308b (i.e. low side power switches) are coupled together within semiconductor package 300.

In other implementations, semiconductor package 300 is an open source/emitter semiconductor package, in which sources 394a, 394b, and 394c are not electrically connected to each other within semiconductor package 300. For example, wirebonds, such as wirebonds 390 can electrically and mechanically connect sources 394a, 394b, and 394c to respective current source terminals of semiconductor package 300.

In the present implementation, the power stage ground (VCOM) of leadframe 370 is coupled to driver circuit 214 (e.g. U-phase, V-phase, and W-phase drivers 244b, 246b, and 248b in FIG. 2B) of common IC 302. Wirebond 388e is connecting source 394c of U-phase power switch 304b to U-phase, V-phase, and W-phase drivers 244b, 246b, and 248b of common IC 302. Common IC 302 is thereby connected to sources 394c, 394b, and 394a of U-phase, V-phase, and W-phase power switches 304b, 306b, and 308b within semiconductor package 300. In some implementations, common IC 302 optionally has ground 394, which is situated on common IC pad 372 of leadframe 370. Ground 394 can be the power stage ground and/or the logic ground. In the implementation shown, where ground 394 is the logic stage ground, the wirebond for VSS terminal 352m may be excluded.

Thus, as described above with respect to FIGS. 1A, 1B, 2A, 2B, and 3A through 3C, in accordance with various implementations, a semiconductor package achieves a multi-phase power inverter having power switches and situated on a leadframe of the semiconductor package and an over-temperature protection circuit configured to reduce current through the power switches based on multiple temperature threshold values of the power switches and a sensed temperature of the power switches. The semiconductor package can thereby offer more granular over-temperature protection, amongst other advantages.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A semiconductor package comprising:
a multi-phase power inverter having power switches and situated on a leadframe of said semiconductor package, said power switches including at least one high side switch and at least one low side switch; and
an over-temperature protection circuit configured to reduce current through said power switches based on multiple temperature threshold values of said power switches and a sensed temperature of said power switches, wherein said over-temperature protection circuit is configured to:
in response to determining that said sensed temperature is greater than a first temperature threshold value of said multiple temperature threshold values and is less than a second temperature threshold value of said multiple temperature threshold values, disable switching of said at least one high side power switch and refrain from disabling switching of said at least one low side power switch; and
in response to determining that said sensed temperature is greater than said second temperature threshold value, periodically disable switching of said at least one high side switch and said at least one low side switch.

2. The semiconductor package of claim 1, wherein periodically disabling switching of said at least one high side switch and said at least one low side switch reduces current through said power switches to a greater extent than disabling switching of said at least one high side power switch and refraining from disabling switching of said at least one low side power switch.

3. The semiconductor package of claim 1, wherein said multiple temperature threshold values comprise at least three temperature threshold values.

4. The semiconductor package of claim 1, wherein said over-temperature protection circuit is further configured to completely disable switching of all of said power switches based on said sensed temperature exceeding a third temperature threshold value of said multiple temperature threshold values.

5. The semiconductor package of claim 1, wherein said sensed temperature is from a temperature sensor that is situated on said leadframe of said semiconductor package.

6. The semiconductor package of claim 1, wherein said sensed temperature is from a temperature sensor that is on a common integrated circuit (IC) with said over-temperature protection circuit.

7. The semiconductor package of claim 1, comprising a driver circuit configured to drive said multi-phase power inverter responsive to a control signal from a control circuit, said driver circuit on a common IC with said over-temperature protection circuit.

8. The semiconductor package of claim 1, comprising a driver circuit configured to drive said multi-phase power inverter responsive to a control signal from a control circuit, said control circuit on a common IC with said over-temperature protection circuit.

9. The semiconductor package of claim 1, wherein said power switches comprise group III-V transistors.

10. A semiconductor package comprising:
a multi-phase power inverter having power switches and situated on a leadframe of said semiconductor package, said power switches including at least one high side switch and at least one low side switch;
an over-temperature protection circuit configured to in response to determining that a sensed temperature of said power switches is greater than a first temperature threshold value and is less than a second temperature threshold value, enter a first mode that reduces current through said power switches; and in response to determining that said sensed temperature is greater than said second temperature threshold value and is less than a third temperature threshold value, enter a second mode that reduces current through said power switches;

wherein said first mode disables switching of said at least one high side power switch and refrains from disabling switching of said at least one low side power switch; and wherein said second mode periodically disables switching of said at least one high side power switch and said at least one low side switch.

11. The semiconductor package of claim 10, wherein said second mode reduces current through power switches to a greater extent than said first mode.

12. The semiconductor package of claim 10, wherein said over-temperature protection circuit is further configured to:

in response to determining that said sensed temperature is greater than said third temperature threshold value, enter a third mode that reduces current through said power switches, wherein said third mode reduces current through said power switches to a greater extent than said second mode.

13. The semiconductor package of claim 12, wherein said third mode comprises completely disabling switching of all of said power switches.

14. The semiconductor package of claim 10, wherein said sensed temperature is from a temperature sensor that is situated on said leadframe of said semiconductor package.

15. The semiconductor package of claim 10, wherein said sensed temperature is from a temperature sensor that is on a common integrated circuit (IC) with said over-temperature protection circuit.

16. The semiconductor package of claim 10, comprising a driver circuit configured to drive said multi-phase power inverter responsive to a control signal from a control circuit, said driver circuit on a common IC with said over-temperature protection circuit.

17. The semiconductor package of claim 10, comprising a driver circuit configured to drive said multi-phase power inverter responsive to a control signal from a control circuit, said control circuit on a common IC with said over-temperature protection circuit.

18. The semiconductor package of claim 10, wherein said power switches comprise group III-V transistors.

* * * * *